United States Patent
Okuta et al.

(10) Patent No.: US 12,360,155 B2
(45) Date of Patent: *Jul. 15, 2025

(54) OPTICAL PROBE, PROBE CARD, MEASURING SYSTEM, AND MEASURING METHOD

(71) Applicant: Kabushiki Kaisha Nihon Micronics, Tokyo (JP)

(72) Inventors: Michitaka Okuta, Tokyo (JP); Yuki Saito, Tokyo (JP); Jukiya Fukushi, Aomori (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 430 days.

This patent is subject to a terminal disclaimer.

(21) Appl. No.: 17/789,760

(22) PCT Filed: Dec. 24, 2020

(86) PCT No.: PCT/JP2020/048340
§ 371 (c)(1),
(2) Date: Jun. 28, 2022

(87) PCT Pub. No.: WO2021/145182
PCT Pub. Date: Jul. 22, 2021

(65) Prior Publication Data
US 2023/0038088 A1 Feb. 9, 2023

(30) Foreign Application Priority Data
Jan. 14, 2020 (JP) .................. 2020-003701

(51) Int. Cl.
*G01R 31/28* (2006.01)
*G01R 1/067* (2006.01)
*G01R 1/07* (2006.01)

(52) U.S. Cl.
CPC ..... *G01R 31/2863* (2013.01); *G01R 1/06733* (2013.01); *G01R 1/071* (2013.01)

(58) Field of Classification Search
CPC . G01R 31/2863; G01R 1/06733; G01R 1/071
See application file for complete search history.

(56) References Cited

U.S. PATENT DOCUMENTS 5,751,871 A * 5/1998 Krivoshlykov ...... G02B 6/4203
385/38
10,120,177 B2 * 11/2018 Okamoto ............... G02B 21/06
(Continued)

FOREIGN PATENT DOCUMENTS

JP S6064443 A 4/1985
JP S6231136 A 2/1987

OTHER PUBLICATIONS

Translation of PCT/JP2020/048340 (Year: 2020).*

*Primary Examiner* — Paresh Patel
(74) *Attorney, Agent, or Firm* — Lorenz & Kopf, LLP

(57) ABSTRACT

An optical probe includes a core part and a clad part arranged along an outer circumference of the core part, and has an incident surface having a radius of curvature R through which an optical signal enters. The radius of curvature R and a central half angle ω at an incident point of the optical signal on the incident surface fulfil the following formulae using a radiation angle γ of the optical signal, an effective incident radius Se of the optical signal transmitted in the core part without penetrating into the clad part on the incident surface, a refractive index n(r) of the core part at the incident point, and a refracting angle β at the incident point:

$R = Se/\sin(\omega)$ $\omega = \pm \sin^{-1}\{[K2^2/(K1^2+K2^2)]^{1/2}\}$ (Continued)

where $K1=n(r)\times\cos(\beta)-\cos(\gamma/2)$ and $K2=n(r)\times\sin(\beta)-\sin(\gamma/2)$.

14 Claims, 14 Drawing Sheets

(56) References Cited

U.S. PATENT DOCUMENTS

| | | | |
|---|---|---|---|
| 11,624,679 B2* | 4/2023 | Okuta | G02B 6/262 |
| | | | 250/227.3 |
| 11,971,296 B2* | 4/2024 | Okuta | G01J 1/4257 |
| 11,971,431 B2* | 4/2024 | Okuta | G01R 1/07342 |
| 2014/0308001 A1* | 10/2014 | Lao | G02B 6/4212 |
| | | | 385/33 |
| 2021/0102864 A1* | 4/2021 | Okuta | G02B 6/2551 |
| 2021/0263070 A1* | 8/2021 | Janunts | G02B 6/4298 |
| 2021/0364552 A1* | 11/2021 | Okuta | G01R 1/07342 |
| 2022/0034714 A1* | 2/2022 | Okuta | G01J 1/0425 |

* cited by examiner

OPTICAL PROBE, PROBE CARD, MEASURING SYSTEM, AND MEASURING METHOD

TECHNICAL FIELD

Embodiments described herein relate to an optical probe, a probe card, a measurement system, and a measurement method used for measuring the properties of optical semiconductor elements.

BACKGROUND ART

Optical semiconductor elements using electrical signals and optical signals as input/output signals are formed on a wafer by use of silicon photonics. A measurement system including electrical probes that transmit the electrical signals and optical probes that transmit the optical signals are used to connect the optical semiconductor elements with a measurement device such as a tester so as to measure the properties of the optical semiconductor element formed on the wafer.

CITATION LIST

Patent Literature

Patent Literature 1: Japanese Unexamined Patent Application Publication No. S62-31136
Patent Literature 1: Japanese Unexamined Patent Application Publication No. S60-64443

SUMMARY OF THE INVENTION

Technical Problem

The measurement method using the optical probes may cause a positional deflection between the optical semiconductor element and an incident surface of the optical probe through which the optical signal enters from the optical semiconductor element or an angular deviation between a central axis of the optical probe and an optical axis of the optical signal from the optical semiconductor element. The positional deflection and the angular deviation fluctuate the power of the optical signal introduced to the optical probe to cause a loss in stability of the output of the measured optical signal. The cause of such fluctuations leads to a decrease in measurement accuracy upon the measurement using the optical probe.

In response to this issue, the present invention provides an optical probe, a probe card, a measurement system, and a measurement method capable of measuring optical semiconductor elements formed on a wafer for a short time with a high accuracy.

Solution to Problem

An aspect of the present invention provides an optical probe provided with an incident surface that is curved and has a radius of curvature through which an optical signal enters. The radius of curvature R and a central half angle $\omega$ at an incident point of the optical signal on the incident surface fulfil the following formulae using a radiation angle $\gamma$ of the optical signal, an effective incident radius $Se$ of the optical signal transmitted in a core part without penetrating into a clad part on the incident surface, a refractive index $n(r)$ of the core part at the incident point, and a refracting angle $\beta$ at the incident point:

$R = Se/\sin(\omega)$ $\omega = \pm \sin^{-1}\{[K2^2/(K1^2+K2^2)]^{1/2}\}$ where $K1 = n(r) \times \cos(\beta) - \cos(\gamma/2)$ and $K2 = n(r) \times \sin(\beta) - \sin(\gamma/2)$.

Advantageous Effects of the Invention

The present invention can provide the optical probe, the probe card, the measurement system, and the measurement method capable of measuring the optical semiconductor elements formed on a wafer for a short time with a high accuracy.

DESCRIPTION OF EMBODIMENTS

Figure 1:
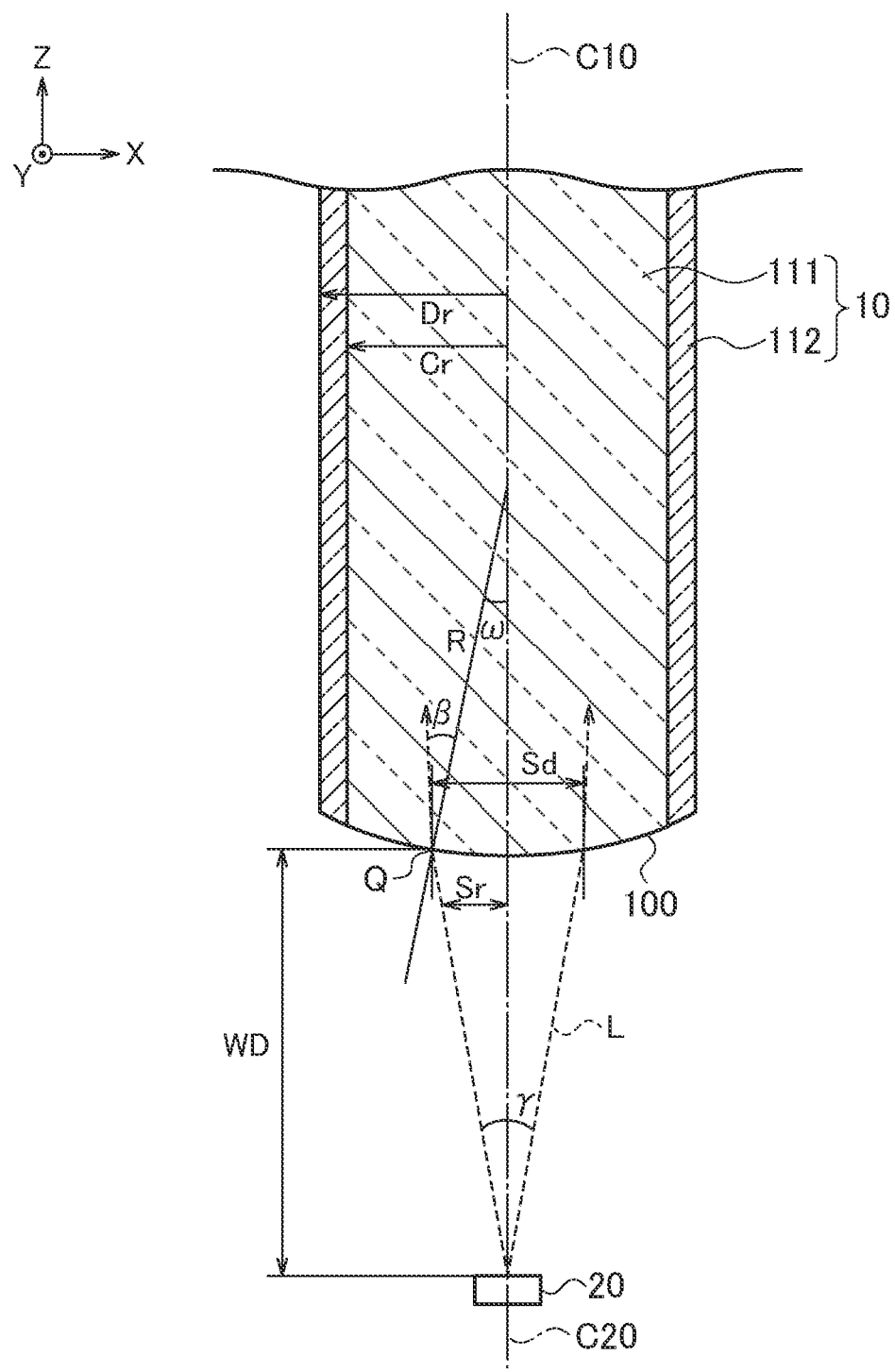
FIG. 1 is a schematic view illustrating a configuration of an optical probe according to a first embodiment.

Some embodiments of the present invention are described below with reference to the drawings. The same or similar elements illustrated in the drawings are denoted below by the same or similar reference numerals. It should be understood that the drawings are shown as schematic illustrations. It should also be understood that the embodiments described below illustrate devices and methods for embodying the technical idea of the present invention, but are not intended to be limited to the structures or arrangements of the constituent elements as described herein. Various modifications can be made to the respective embodiments according to the present invention in terms of the appended claims.

First Embodiment

An optical probe 10 according to a first embodiment of the present invention receives an optical signal L output from an optical semiconductor element 20, as illustrated in FIG. 1. The optical probe 10 has a graded-index optical waveguide including a core part 111 and a clad part 112 arranged along the outer circumference of the core part 11. The core part 111 has a larger refractive index than the clad part 112. FIG. 1 illustrates an end part of the optical probe 10 on one side including an incident surface 100 through which the optical signal L enters. The incident surface 100 is a convex surface having a constant radius of curvature R.

The core part 111 has a core radius Cr, as shown in FIG. 1. The optical probe 10 has a probe radius Dr including the clad part 112. The optical probe 10 as used herein may be an optical fiber or a combination of an optical fiber and a lens. For example, a graded-index (GI) optical fiber may be used to manufacture the optical probe 10.

FIG. 1 defines a Z-direction in which a central axis C10 of the core part 111 of the optical probe 10 and an optical axis C20 of the optical signal L extend. FIG. 1 also defines a plane surface perpendicular to the Z-direction as an X-Y plane, defines the right-left direction of the sheet of FIG. 1 as an X-direction, and defines the direction perpendicular to the sheet as a Y-direction.

The optical semiconductor element 20 as used herein is a vertical-cavity surface-emitting laser (VCSEL), for example. The optical semiconductor element 20 and the optical probe 10 are optically connected to each other so that the optical signal L output from the optical semiconductor element 20 enters the optical probe 10.

The optical probe 10 and the optical semiconductor element 20 are arranged separately from each other by a working distance WD in the Z-direction. The working distance WD is set within a range that enables the optical probe 10 to receive the optical signal L output from the optical semiconductor element 20. In other words, the working distance WD is set such that the incident range on the incident surface 100 of the optical signal L is defined on the inside of the outer edge of the core part 111. The incident range of the optical signal L is defined in a direction in which the optical signal L advances at an intensity corresponding to $1/e^2$ or greater of a peak value.

As illustrated in FIG. 1, the optical signal L having a radiation angle $\gamma$ is output from the optical semiconductor element 20. The optical signal L advances in the core part 111 through an incident point Q that is an edge of the incident range of the optical signal L on the incident surface 100 while making a refracting angle $\beta$ with the direction of the radius of curvature. A central half angle of the incident surface 100 at the incident point Q is indicated by $\omega$.

FIG. 1 indicates the diameter of the optical signal L by an incident diameter Sd having the radiation angle $\gamma$ on the incident surface 100 within the incident range, and indicates the radius within the incident range by an incident radius Sr. The incident diameter Sd is given by the following formula (1) using the radiation angle $\gamma$ of the optical signal L:

$$Sd = 2 \times WD \times \tan(\gamma/2) \qquad (1)$$

Figure 2:
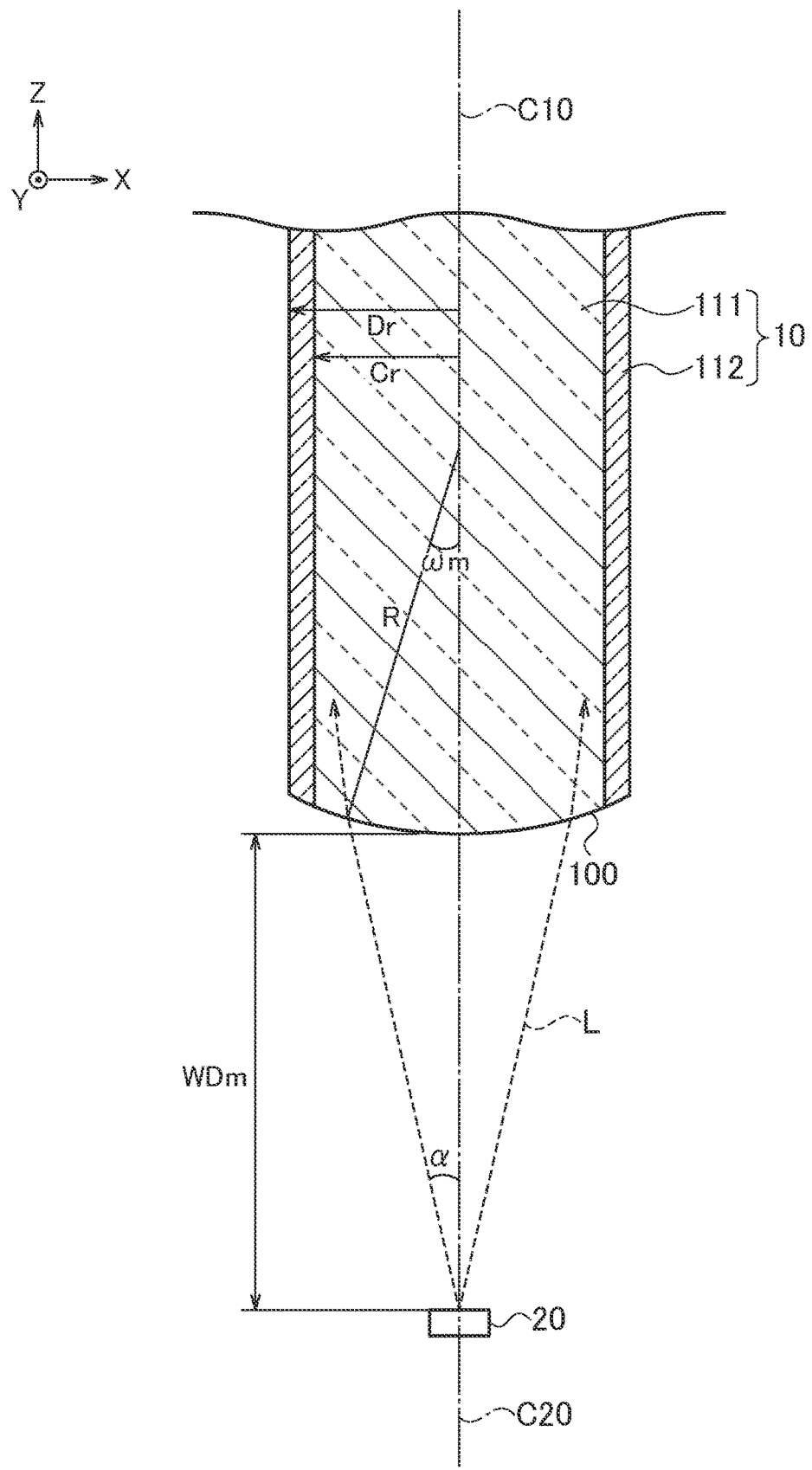
FIG. 2 is a schematic view illustrating a configuration of the optical probe at a maximum working distance.

FIG. 2 illustrates a possible maximum working distance WD obtained between the incident surface 100 of the optical probe 10 and the optical semiconductor element 20 (referred to below as a "maximum working distance WDm"). A radiation half angle at the maximum working distance WDm is indicated by $\alpha$ in FIG. 2. The central half angle $\omega$ is maximum when the central axis C10 and the optical axis C20 conform to each other at the maximum working distance WDm. The maximum central half angle $\omega$ as used herein is referred to below as a "maximum central half angle $\omega m$".

Figure 3:
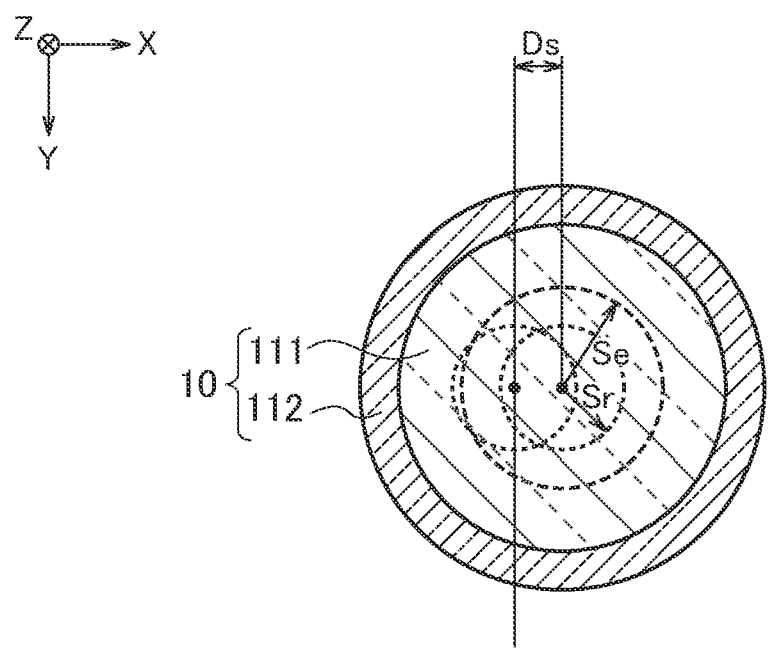
FIG. 3 is a schematic plan view showing an example of a deflection between a central axis of the optical probe and an optical axis of an optical signal.

A positional deflection between the optical probe 10 and the optical semiconductor element 20 on the X-Y plane needs to be considered when the optical signal L is measured. FIG. 3 illustrates a state in which the central axis C10 of the optical probe 10 and the optical axis C20 of the optical signal L are shifted in the X-direction due to the positional deflection.

FIG. 3 indicates, by an effective incident radius Se, the incident region on the incident surface 100 of the optical signal L transmitted to the core part 11 without passing through the clad part 112. FIG. 3 also shows the incident radius Sr of the optical signal L. A transmission loss of the optical signal L can be avoided in the optical probe 10 when the incident radius Sr is included within the range defined by the effective incident radius Se if the positional deflection is caused between the optical probe 10 and the optical semiconductor element 20. FIG. 3 indicates, by an incident stable distance $D_S$, the distance between the central axis C10 and the optical axis C20 that does not cause the transmission loss of the optical signal L.

Figure 4:
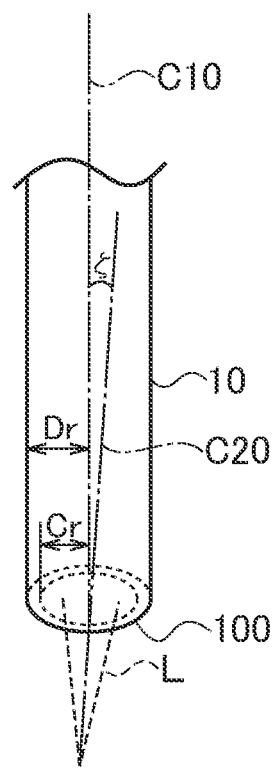
FIG. 4 is a schematic view showing an example of a tilt angle.

An incident deviation may also be caused when the central axis C10 of the optical probe 10 and the optical axis C20 of the optical signal L are not parallel but the central axis C10 and the optical axis C20 intersect with each other at a tilt angle $\zeta$, as illustrated in FIG. 4. As described in detail below, the optical probe 10 can avoid the incident deviation if the tilt angle $\zeta$ is caused.

A measurement of the radiation angle of the optical signal L is described below. The properties showing a relation of the incident intensity with respect to a moving distance (referred to below as an "incident intensity pattern") can be obtained by moving the optical semiconductor element 20 in the X-direction or the Y-direction relative the incident surface 100 while the working distance WD is kept constant. First, the measurement of the incident intensity pattern by use of an optical probe in which the incident surface 100 is flat (referred to below as a "planar optical probe") as illustrated in FIG. 5 is described below.

Figure 5:
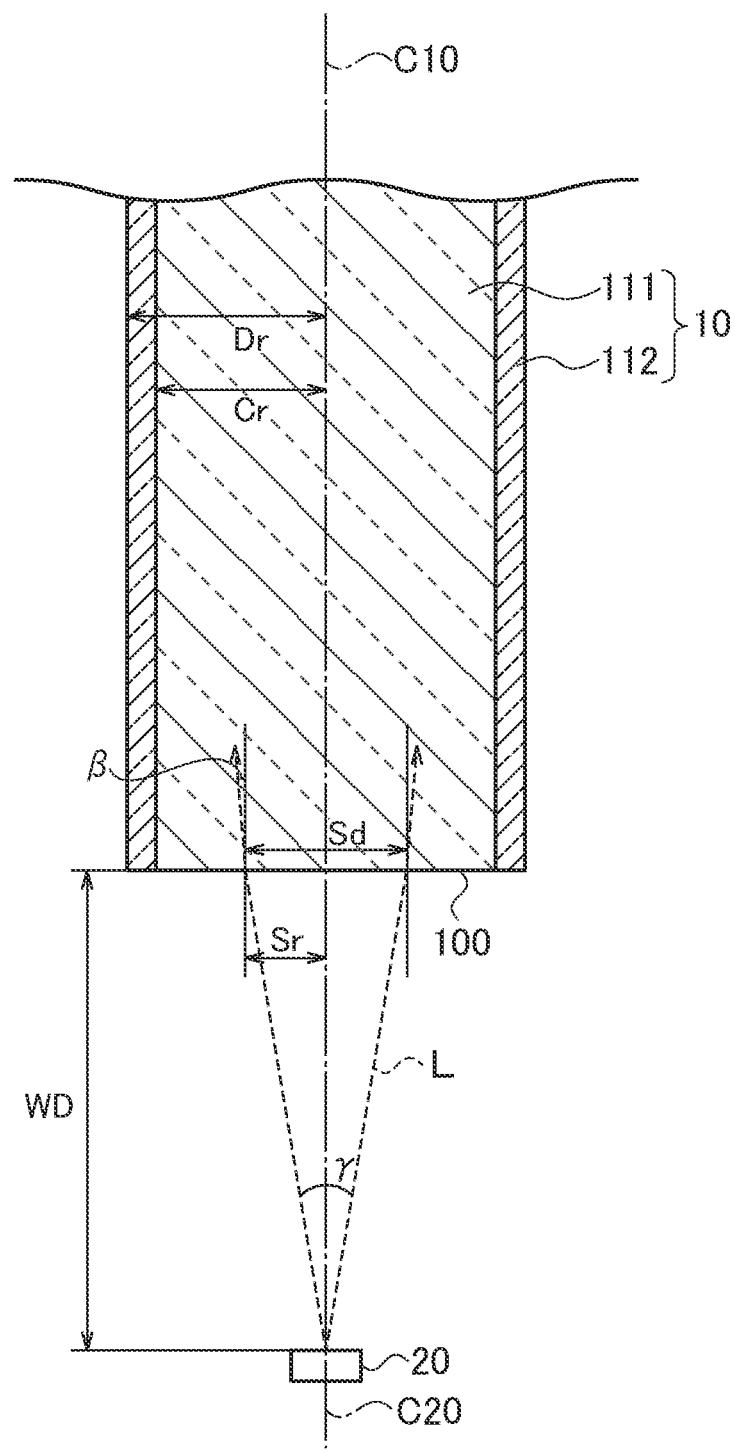
FIG. 5 is a schematic view illustrating a configuration of a planar optical probe in which an incident end is a flat surface.

An optical fiber having a core diameter Cd of $2 \times Cr$ and a numerical aperture NA of $\sin(\alpha f)$ is used for the planar optical probe illustrated in FIG. 5. The incident diameter Sd of the optical signal L entering the incident surface 100 is given by $2 \times Sr$. The radiation angle $\gamma$ and a radiation allowable radius αf fulfill a relation of γ<2αf according to the numerical aperture NA of the planar optical probe (given by αf=sin⁻¹(NA)).

The optical signal L having the radiation angle γ when entering the incident surface 100 of the planar optical probe and advancing into the inside of the core part 111 is emitted to the boundary surface between the core part 111 and the clad part 112 at an incident angle of π/2−β. The refracting angle β is given by the following formula (2) by use of a refractive index n(r) of the core part 111 at a distance r from the central axis C10 in the radial direction:

$$\beta = \sin^{-1}[\sin(\gamma/2)/n(r)] \tag{2}$$

The refractive index n(r) is given by the following formula (3):

$$n(r) = n(c) \times [1 - (A^{1/2} \times r)^2/2] \tag{3}$$

where n(c) is the refractive index of the core part 111 at the central axis C10, and $A^{1/2}$ is a graded index constant of the core part 111.

A boundary refractive index n(rc) and a boundary refracting angle β(rc) of the core part 111 at a position having the core radius Cr are given by the following formulae (4) and (5):

$$n(rc) = n(c) \times (1 - (A^{1/2} \times Cr)^2/2) \tag{4}$$

$$\beta(rc) = \sin^{-1}[\sin(\gamma/2)/n(rc)] \tag{5}$$

When the refracting angle β is the boundary refracting angle β(rc) or greater, the optical signal L penetrates and radiates to the clad part 112 without being reflected and transmitted inside the core part 111. The optical signal L transmitted through the core part 111 is then attenuated.

A measurement of the radiation angle of the optical signal L is described below. The optical semiconductor element 20 is moved with respect to the incident surface 100 on the X-Y plane with the working distance kept constant, so as to obtain the incident intensity pattern of the optical signal L showing a relation between the incident intensity and the moving distance.

Figure 6:
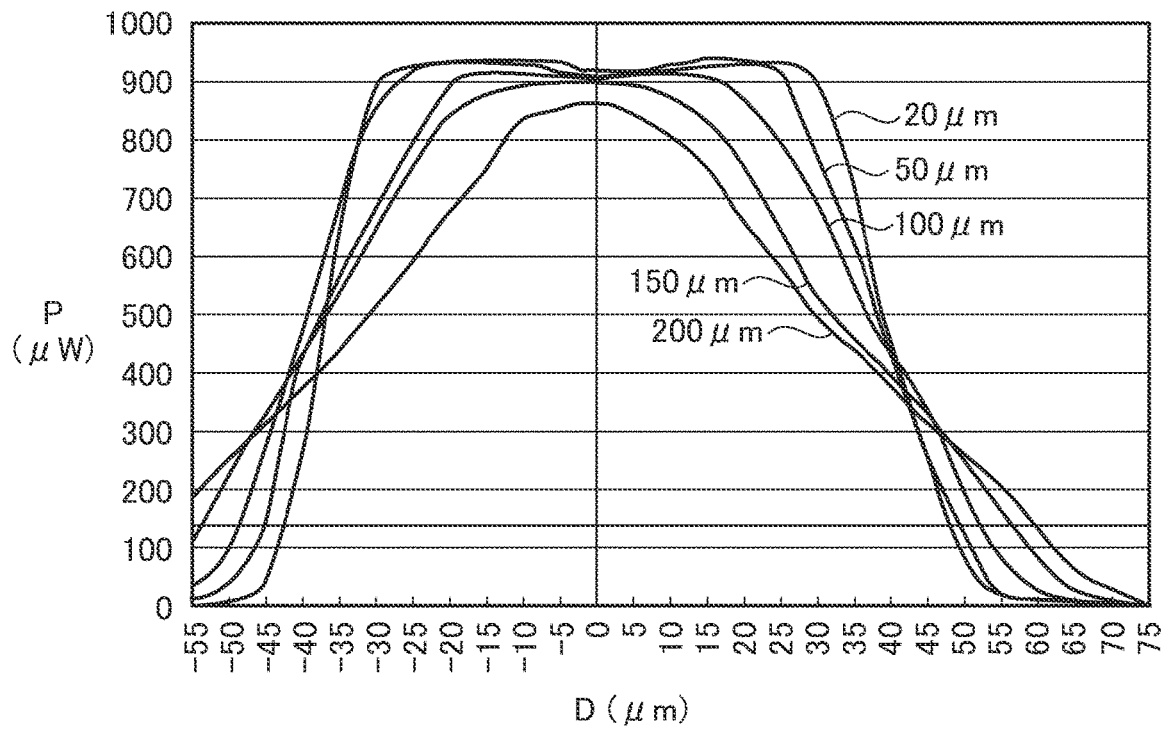
FIG. 6 is a graph showing an example of an incident intensity pattern upon the measurement by use of the planar optical probe.

FIG. 6 shows the incident intensity pattern of the incident intensity P of the optical signal L when the optical semiconductor element 20 is moved with respect to the incident surface 100 of the planar optical probe at each of the working distances WD of 20 µm, 50 m, 100 µm, 150 µm, and 200 µm. A distance from the central axis C10 to the outer edge of the optical signal L on the incident surface 100 (referred to below as a "moving distance D") is larger as the working distance WD is larger. FIG. 6 shows a case in which the optical signal L with the radiation angle γ of 17.6° is led to enter the incident surface 100 of the planar optical fiber having a core radius Cr of 44.5 µm and a numerical aperture NA of 0.29.

As shown in FIG. 6, the incident intensity pattern of the incident intensity P has a trapezoidal shape when the working distance WD is small. A peak value of the incident intensity P is decreased as the working distance WD is larger so that the shape of the incident intensity pattern is approximate to a Gaussian curve. The incident intensity pattern shown in FIG. 6 indicates that the attenuation of the peak value of the incident intensity P tends to be increased with respect to the moving distance D when the working distance WD is 100 µm or greater.

The working distance WD is set at which the incident diameter Sd (Sd=2×Sr) and the core diameter Cd (Cd=2×Cr) are substantially equal to each other according to the incident intensity pattern. According to the incident intensity pattern shown in FIG. 6, the peak value of the incident intensity P is not decreased and the shape of the incident intensity pattern is approximate to the Gaussian curve when WD=150 µm, which is the condition in which the outer edge of the core part 111 of the planar optical probe substantially conforms to the outer edge of the optical signal L. A $1/e^2$ moving distance De on the X-Y plane at which the incident intensity P is $1/e^2$ of the peak value is given by De=4×Sr=112 µm. The following formula (6) is thus fulfilled with regard to a $1/e^2$ radiation angle γe at which the incident intensity P is $1/e^2$ of the peak value:

$$\tan(\gamma e/2) = De/(4 \times WD) = 0.187 \tag{6}$$

According to the formula (6), the relation of γe=2×tan⁻¹(De/(4×WD))=21.2° is fulfilled.

A ½ moving distance Dh at which the incident intensity P is ½ of the peak value is 77.5 µm. The following formula (7) is thus fulfilled with regard to a ½ radiation angle γh at which the incident intensity P is ½ of the peak value:

$$\tan(\gamma h/2) = Dh/(4 \times WD) = 0.129 \tag{7}$$

According to the formula (7), the relation of γh=2×tan⁻¹(Dh/(4×WD))=14.7° is fulfilled.

As described above, the radiation angle of the optical signal L can be calculated according to the relation between the relative moving distance between the incident surface 100 and the optical semiconductor element 20 on the X-Y plane perpendicular to the central axis C10 and the incident intensity of the optical signal L.

The measured values of the respective radiation angles by use of a measurement device such as a far field pattern (FFP) device (each simply referred to below as a "measured value") are as follows: γe=21.2° and γh=17.6°. When the optical semiconductor element 20 is a VCSEL, the incident intensity pattern of the incident intensity P does not make the Gaussian curve but is substantially approximate to a trapezoidal shape. The ½ radiation angle yh at which the incident intensity P is ½ of the peak value is thus measured to result in a small value.

Next, a measurement of the radiation angle made by the optical probe 10 in which the incident surface 100 is a curved surface having a radius of curvature R is described below. The numerical aperture NA on the incident surface 100 of the optical probe 10 is defined as sin(α). The relation of the following formula (8) is fulfilled on the incident surface 100 of the optical probe 10 according to Snell's law:

$$\sin(\alpha + \omega m) = n(r) \times \sin(\beta + \omega m) \tag{8}$$

The following formula (9) is obtained according to the formula (8):

$$\alpha = \sin^{-1}[n(r) \times \sin(\beta + \omega m)] - \omega m \tag{9}$$

The relation of ωm=Cr/R is fulfilled at the end part of the core diameter Cd.

The relation between the radius of curvature R of the incident surface 100 and the radiation half angle α of the optical signal L thus can be obtained. The radiation half angle α is also an allowable incident half angle of the optical signal L entering the incident surface 100. When the radiation angle γ exceeds 2×α, the optical signal L penetrates to be emitted to the clad part 112 through the boundary between the core part 111 and the clad part 112 and is thus attenuated, causing a transmission loss accordingly.

Figure 7:
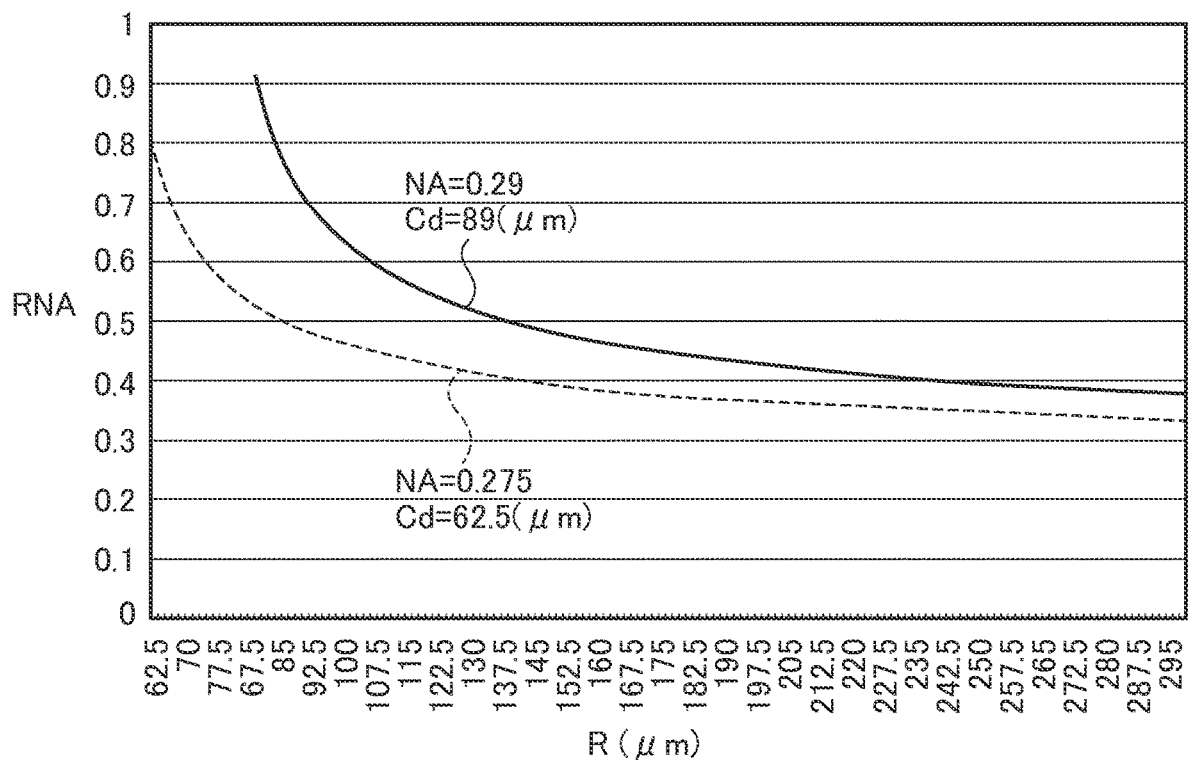
FIG. 7 is a graph showing a relation between a radius of curvature of the incident surface of the optical probe and a numerical aperture of the incident surface.

FIG. 7 shows a relation of the numerical aperture on the incident surface 100 (referred to below as an "incident numerical aperture RNA") with respect to the radius of curvature R of the incident surface 100 in the case of using an optical fiber with NA=0.29 and the core diameter Cd=89 µm and an optical fiber with NA=0.275 and the core diameter Cd=62.5 µm.

As shown in FIG. 7, the incident numerical aperture RNA of the optical probe 10 is larger as the radius of curvature R is smaller. For example, when the optical fiber with NA=0.29 is used for the optical probe 10 having the radius of curvature R of 145 µm, the incident boundary conditions of the optical signal L fulfill RNA=0.5 and γ=60°. The phrase "incident boundary conditions" refers to conditions for leading the optical signal L to be transmitted through the core part 111 without penetrating into the clad part 112. When the optical fiber with NA=0.275 is used for the optical probe 10 having the radius of curvature R of 145 µm, the incident boundary conditions of the optical signal L fulfill RNA=0.4 and γ=48°.

When the radiation angle γ of the optical signal L fulfills the relation of α≥γ/2, the optical signal L after entering the core part 11 of the optical probe 10 does not penetrate into the clad part 112 but is transmitted through the core part 111 with almost no attenuation. As described above, the curved incident surface 100 can avoid a transmission loss and allow the optical signal L having a relatively large radiation angle γ to be introduced therethrough, as compared with the case of using the optical probe with the flat incident surface 100. The use of the curved incident surface 100 is thus effective particularly when the radiation angle γ of the optical signal L is relatively large. Namely, regulating the radius of curvature R can adjust the incident boundary conditions of the optical probe 10 when the radiation angle γ of the optical signal L is large.

When the optical probe 10 is moved in the X-direction that is the left direction of the sheet by the incident stable distance $D_S$, the following formula (10) is fulfilled on the incident surface 100 of the optical probe 10:

$$\sin(\gamma/2+\omega)=n(r)\times\sin(\beta+\omega) \quad (10)$$

The following formula (11) is obtained according to a relational expression of $\beta=\sin^{-1}[NA/n(r)]$ regarding the numerical aperture NA of the optical waveguide (such as an optical fiber) used for the optical probe 10:

$$\omega=\pm\sin^{-1}\{[K2^2/(K1^2+K2^2)]^{1/2}\} \quad (11)$$

where the coefficient K1 and the coefficient K2 correspond to the respective values fulfilling the following formulae:

$$K1=n(r)\times\cos(\beta)-\cos(\gamma/2)$$

$$K2=n(r)\times\sin(\beta)-\sin(\gamma/2).$$

When the effective incident radius Se and the core radius Cr of the optical probe 10 conform to each other, the radius of curvature R fulfills the relation of the following formula (12), and the central half angle ω is given by the following formula (13) by use of the radiation half angle α at which the optical signal L is allowed to enter the optical probe 10 when the working distance WD is the maximum working distance WDm:

$$R \geq Cr/\sin(\omega) \quad (12)$$

$$\omega=\pm\sin^{-1}\{[K2^2/(K1^2+K2^2)]^{1/2}\} \quad (13)$$

where WDm=Cr/tan(α). The coefficient K1 and the coefficient K2 in the formula (13) correspond to the respective values fulfilling the following formulae:

$$K1=n(r)\times\cos(\beta)-\cos(\alpha)$$

$$K2=n(r)\times\sin(\beta)-\sin(\alpha)$$

where $\alpha=\sin^{-1}[n(r)\times\sin(\beta+\omega)]-\omega$. When the radiation angle γ of the optical signal L from the optical semiconductor element to be measured is already known, the respective values α and ω are set to fulfill 2+≥γ, so as to define the radius of curvature R of the incident surface 100.

When the optical probe 10 is moved by the incident stable distance $D_S$, the following formulae (14) to (16) are fulfilled:

$$Se=R\times\sin(\omega) \quad (14)$$

$$D_S=Se-Sr \quad (15)$$

$$Sr=WD\times\tan(\gamma/2) \quad (16)$$

where Cr≥Se≥Sr≥0, and R≥Dr. The effective incident radius Se is larger as the radius of curvature R is larger, and the incident radius Sr is smaller as the working distance WD is smaller. Setting the incident stable distance $D_S$ to be large, namely, setting the effective incident radius Se to be large and the incident radius Sr to be smaller enables the allowable value of the positional deflection between the central axis C10 of the optical probe 10 and the optical axis C20 of the optical signal L to be larger in order to measure the stable properties of the optical signal L. The following formula (17) regarding the radius of curvature R is obtained according to the formula (14):

$$R=Se/\sin(\omega) \quad (17).$$

Figure 8:
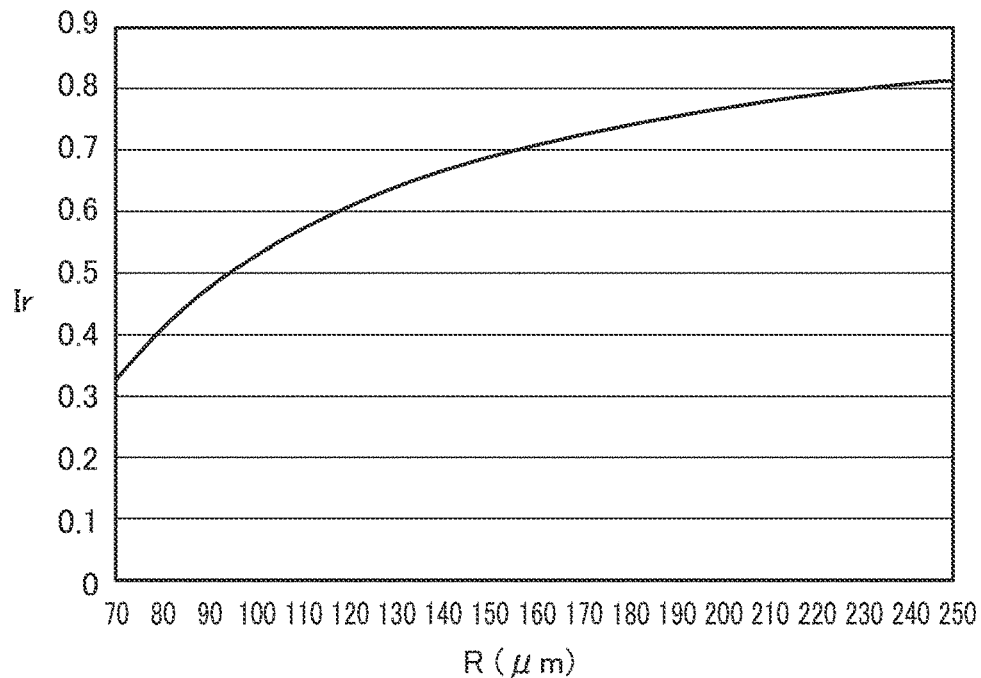
FIG. 8 is a graph showing a relation between the radius of curvature of the incident surface and an incident angle ratio.

FIG. 8 is a graph showing a relation between the radius of curvature R and an incident angle ratio Ir between the optical probe 10 and the planar optical probe with regard to the incident angle of the optical signal L to the boundary surface between the core part 111 and the clad part 112 after passing through the incident surface 100 (referred to below as a "clad incident angle θ"). The incident angle ratio Ir fulfills the relation Ir=θ2/θ1 where θ1 is the clad incident angle of the planar optical probe, and θ2 is the clad incident angle of the optical probe 10 having the radius of curvature R. The planar optical probe has the radius of curvature R that is infinite, and the incident angle ratio Ir is one.

As shown in FIG. 8, the incident angle ratio Ir is smaller and the clad incident angle θ is smaller as the radius of curvature R is smaller. An occurrence of fluctuation in transmission of the optical signal L in the core part 111 of the optical probe 10 is thus decreased as the radius of curvature R is smaller if a change in the angle of the optical axis C20 of the optical signal L with respect to the central axis C10 of the optical probe 10 is caused. An optical probe array in which the plural optical probes 10 are arranged in array, for example, tends to cause a minute tilt angle ζ in the X-direction or the Y-direction to lead the clad incident angle θ to vary. The clad incident angle θ is, however, small in the optical probe 10 having the curved incident surface 100, and is sufficiently smaller than a clad incident critical angle θ(rc) at which the optical signal L penetrates into the clad part 112 and attenuated if the angle of the optical axis C20 with respect to the central axis C10 varies because of the tilt angle ζ, so as not to easily lead to the attenuation caused by the emission of the optical signal L into the clad part 112. This avoids the variation in the transmission of the optical signal L in the core part 111 derived from the tilt angle ζ.

Figure 9:
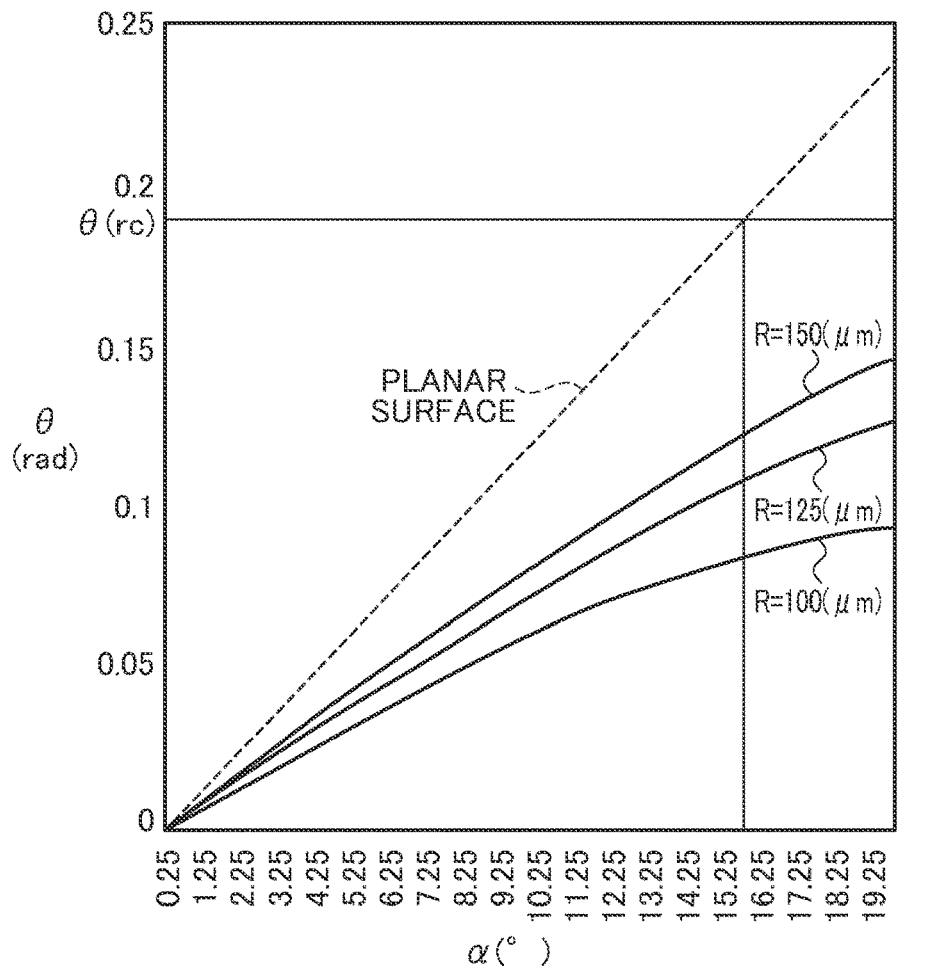
FIG. 9 is a graph showing a relation between a radiation half angle of the optical signal and a clad incident angle.

FIG. 9 is a graph showing results of the comparison between the case in which the incident surface 100 is flat and the case in which the incident surface 100 has the radius of curvature R of each of 100 µm, 125 µm, and 150 µm with regard to the relation between the clad incident angle θ and the radiation half angle α at which the optical signal L is allowed to enter. The clad incident critical angle θ(rc) shown in FIG. 9 is a critical angle of the clad incident angle θ, and the optical signal L penetrates into the clad part 112 and is thus attenuated when the clad incident angle θ is the clad incident critical angle θ(rc) or greater. The results shown in the graph in FIG. 9 revealed that the curved incident surface 100 can decrease the clad incident angle θ with respect to the radiation angle γ of the optical signal L. In addition, the clad incident angle θ tends to be smaller as the radius of curvature R is smaller. The clad incident angle θ is thus sufficiently smaller than the clad incident angle θ(rc) that is the critical angle when the incident surface 100 is curved, as shown in FIG. 9. The use of the curved incident surface 100 can avoid the attenuation of the optical signal L if an angular deviation is caused at the incident angle of the optical signal L on the incident surface 100 derived from the tilt angle ζ.

Figure 10:
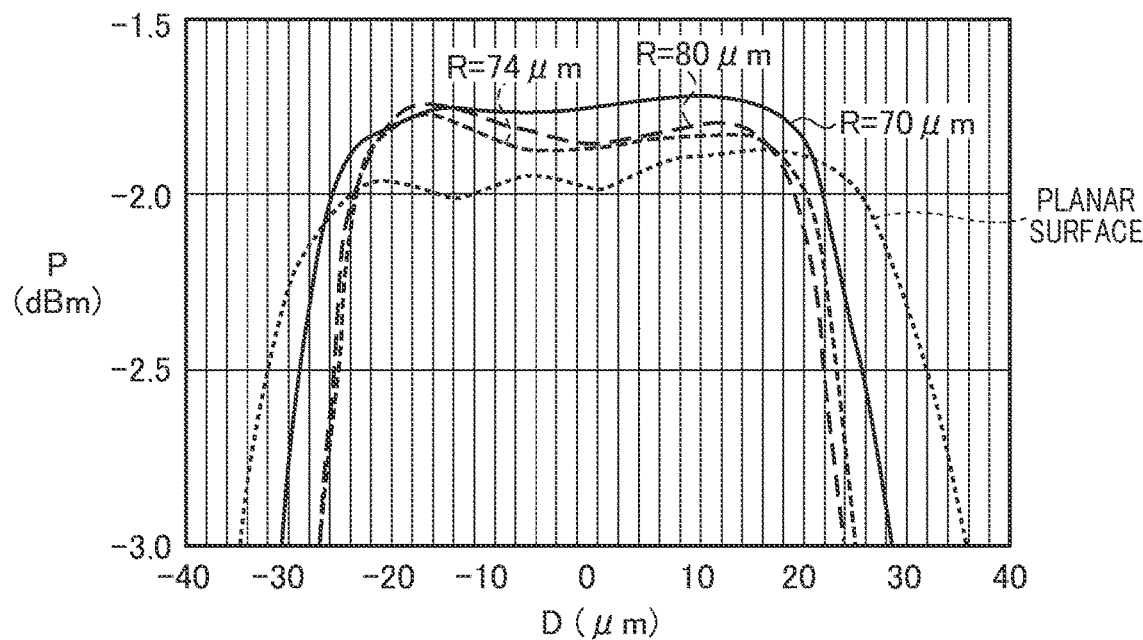
FIG. 10 is a graph showing an example of the incident intensity pattern.

FIG. 10 is a graph showing a comparison of the measured values of the incident intensity patterns when the working distance WD is 100 μm in each of the case in which the incident surface 100 of the optical probe 10 has the radius of curvature R of each of 70 μm, 74 μm, and 80 μm and the case in which the incident surface 100 is flat. The axis of abscissas in the graph shown in FIG. 10 indicates the moving distance D. As shown in FIG. 10, the incident intensity P tends to be greater as the radius of curvature R is smaller. This is because the clad incident angle is decreased due to the radius of curvature R, and the attenuation caused by the emission into the clad part is thus avoided. In contrast, when the incident surface 100 is flat, the intensity of the intensity pattern is lower than the case in which the incident surface 100 is convex, and the both shoulders of the incident intensity pattern are rounded to be gently attenuated.

Figure 11:
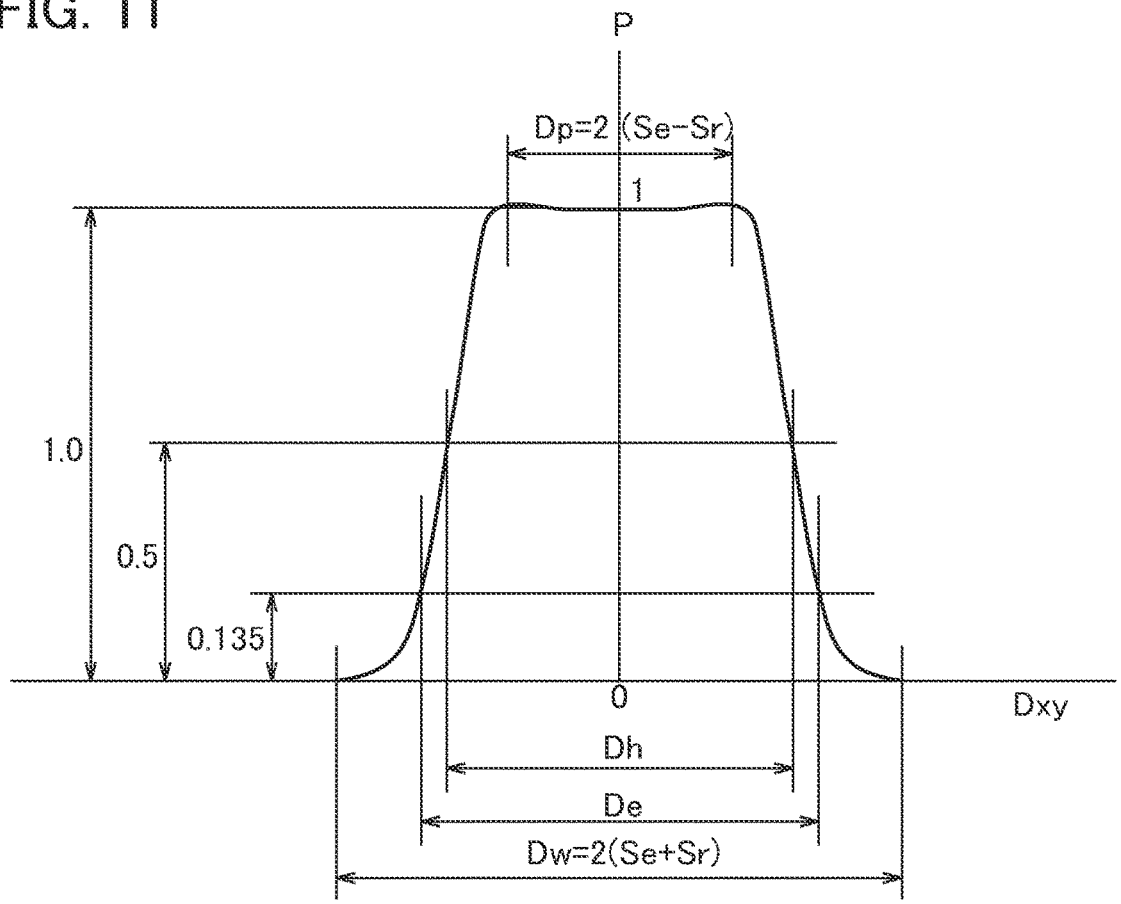
FIG. 11 is an image diagram illustrating the incident intensity pattern when the position of the optical axis of the optical signal is shifted with respect to the central axis of the optical probe.

FIG. 11 is an image diagram of the incident intensity pattern in the case in which the position of the optical axis C20 of the optical signal L is moved by a distance Dxy from the central axis C10 of the optical probe 10 in the X-direction or the Y-direction at the constant working distance WD. The incident intensity pattern made in association with the change by the distance Dxy shows a substantially trapezoidal shape. The flat part of the incident intensity pattern at the incident intensity P=1 is within an incident stable range corresponding to the incident stable distance $D_S$ in the plus direction and the minus direction. The incident intensity P does not vary if the positional deviation is caused in the incident stable range, so as to obtain the stable incident intensity. The incident moving range Dw and the incident stable range Dp in which at least part of the optical signal L enters the core part 111 of the optical probe 10 are respectively given by: Dw=2(Se+Sr) and Dp=2(Se−Sr)=2 $D_S$.

When the incident surface 100 is flat, the relation of Se=Cr is fulfilled. A radiation angle γx in the X-direction and a radiation angle γy in the Y-direction in which the transmission loss is not caused are each calculated according to the following formulae (18) and (19):

$$\gamma x = 2 \times \tan^{-1}(Srx/WD) \quad (18)$$

$$\gamma y = 2 \times \tan^{-1}(Sry/WD) \quad (19)$$

where Cr≥Se≥Sr≥0.

Figure 12:
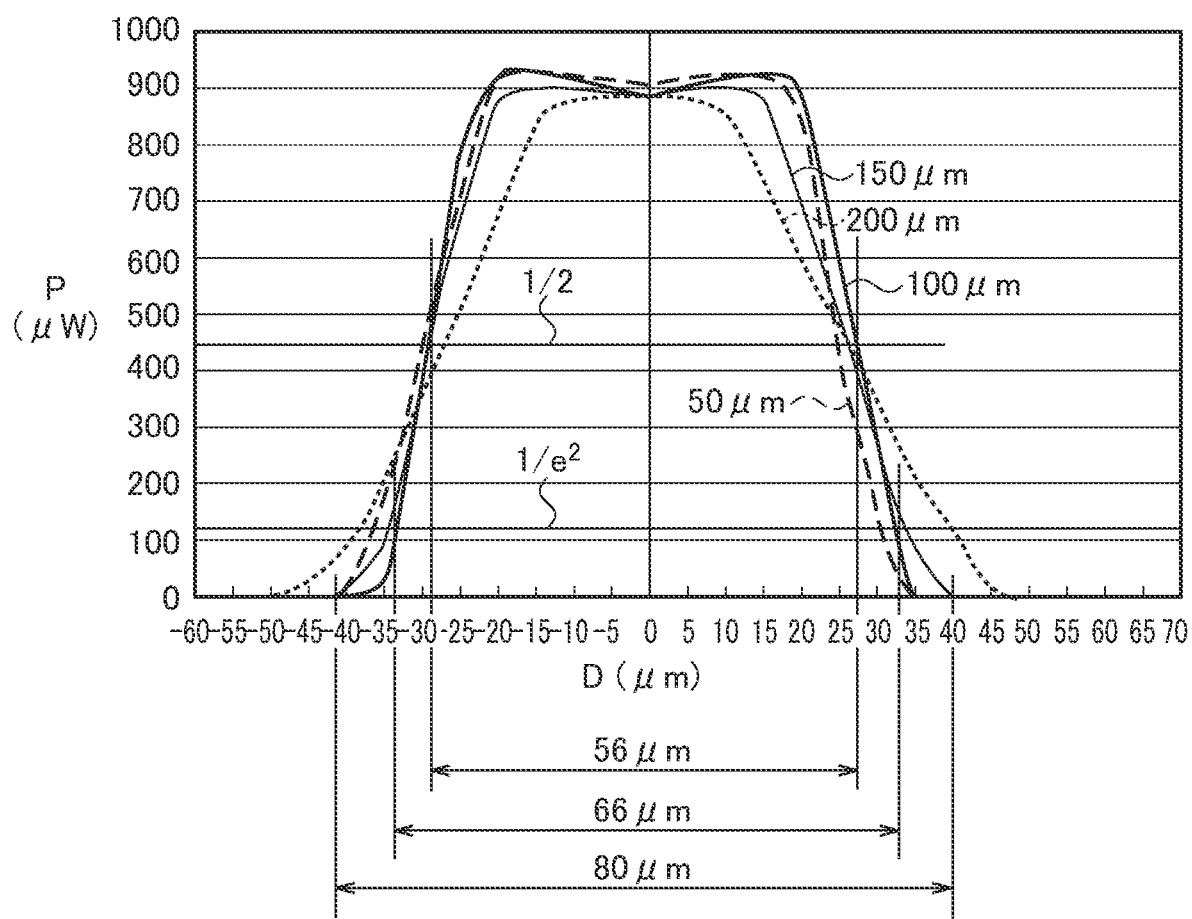
FIG. 12 is a graph showing a change in the incident intensity pattern when the working distance is changed.

FIG. 12 is a graph showing a change in the incident intensity pattern when the working distance WD is changed in a range of 50 μm to 200 μm. FIG. 12 shows a case of using the optical probe 10 in which the radius of curvature R on the incident surface 100 is 70 μm. When the optical semiconductor element 20 is a VCSEL, the far field pattern shows an intensity distribution having a trapezoidal shape, and the ½ radiation angle γh at which the intensity is ½ of the peak intensity is the radiation angle of the average of the intensity distribution. The effective incident radius Se and the incident radius Sr thus can be presumed to show a trace of the incident intensity average. According to FIG. 11 and the relations of Se−Sr=Dp/2 and Se+Sr=Dw/2, the respective radii Se and Sr are given by Se=¼×(Dw+Dp) and Sr=¼×(Dw−Dp), where Dp=40 (μm) and Dw=80 (μm) according to FIG. 12. The respective radii Se and Sr are thus obtained as follows according to the above equations: Se=30 (μm) and Sr=10 (μm). In the case of WD=100 μm, the relation of γh=2×tan$^{-1}$(Sr/WD)=2×tan$^{-1}$(10/100)=11.4° is fulfilled. When the ½ radiation angle γh and the 1/e$^2$ radiation angle γe are presumed to have a proportional relation according to the intensity distribution, the relation of γe=2×(De/Dh)tan$^{-1}$(γh)=2×(66/56)tan$^{-1}$(10/100)=13.5° is fulfilled according to the incident intensity pattern.

In the case of WD=100 to 200 (μm) in the measurement described above, however, the measured value does not make the far field pattern but is approximate to a narrower near field pattern, and deviates from the respective values γe=21.2° and γh=17.6° obtained from the measured value. The correction thus needs to be executed so as to obtain the far field pattern value.

When such a difference is caused between the value obtained from the incident intensity pattern and the value based on the measured value, the processing described below is executed so as to reduce the difference.

When the radiation angle γ of the measured value is used, the relation of tan(γh/2)=Sr/cWD is fulfilled. Since the conditions in which the incident intensity P is led to be ½ of the peak value fulfill the relations of Sr=10 μm and γh=17.6°, the relation of tan(17.6°/2)=Sr/cWD=10/cWD=0.155 is fulfilled, so as to obtain cWD=64.5 μm. The value cWD=Sr/tan(γ/2) corresponds to a working distance obtained from the measured value of the radiation angle (referred to below as an "assumed working distance").

The 1/e$^2$ radiation angle γe and the ½ radiation angle γh are obtained as follows by use of the assumed working distance cWD:

$$\gamma e = 2 \times (De/Dh) \times \tan^{-1}[Sr/(cWD)]$$

$$\gamma h = 2 \times \tan^{-1}[Sr/(cWD)]$$

The respective radiation angles γe and γh in the X-direction and the Y-direction are thus obtained by use of the values of the 1/e$^2$ moving distance De and the ½ moving distance Dh actually measured. For example, the respective radiation angles are set in accordance with a difference from a reference radiation angle on the basis of a radiation angle of a reference VCSEL. This can set the respective radiation angles based on the measured value more accurately.

Figure 13:
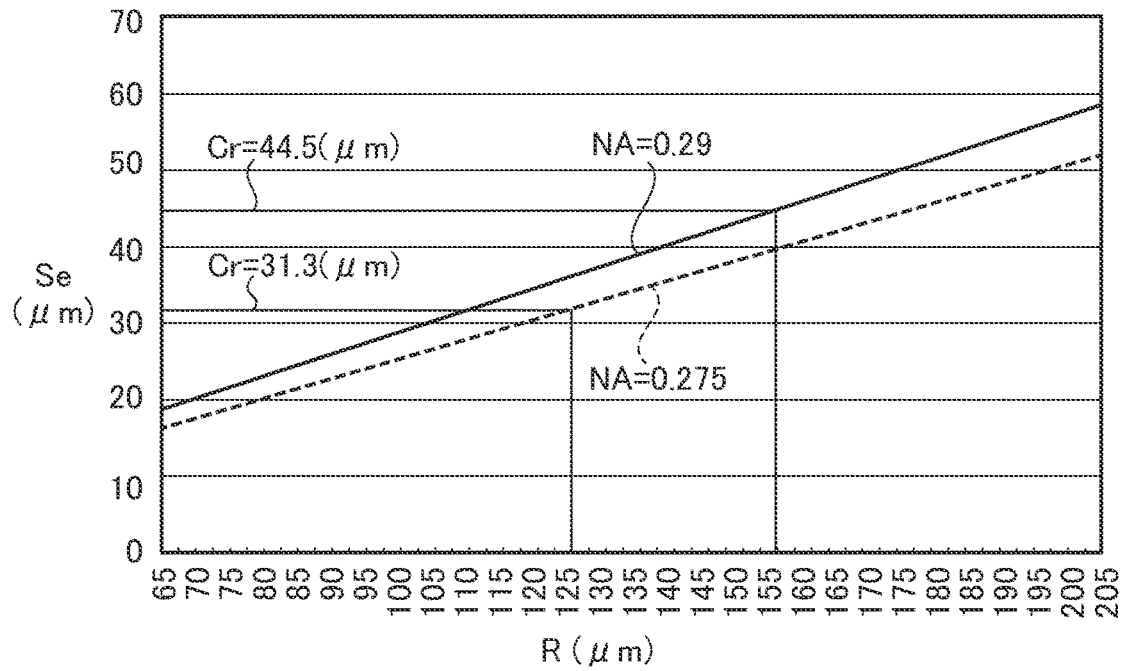
FIG. 13 is a graph showing a relation between the radius of curvature of the incident surface and an effective incident radius.

FIG. 13 is a graph showing theoretical values of the relation between the radius of curvature R of the incident surface 100 and the effective incident radius Se. FIG. 13 shows the case in which the numerical aperture NA of the optical fiber used for the optical probe 10 is 0.29 and the case in which the numerical aperture NA is 0.275. The relation between the radius of curvature R and the effective incident radius Se can be obtained according to the formula (17).

Leading the effective incident radius Se and the core diameter Cd to conform to each other can make the maximum use of the effective incident radius Se so as to avoid the transmission loss caused by the positional deviation. To lead the effective incident radius Se and the core diameter Cd to conform to each other, the radius of curvature R can be set to around 155 μm in the optical probe 10 having the numerical aperture NA=0.29 and the core radius Cr=44.5

μm according to the condition of Se=Cr=44.5 μm shown in FIG. 13. The radius of curvature R can also be set to around 127 μm in the optical probe 10 having the numerical aperture NA=0.275 and the core radius Cr=31.3 μm according to the condition of Se=Cr=31.3 μm shown in FIG. 13.

Figure 14:
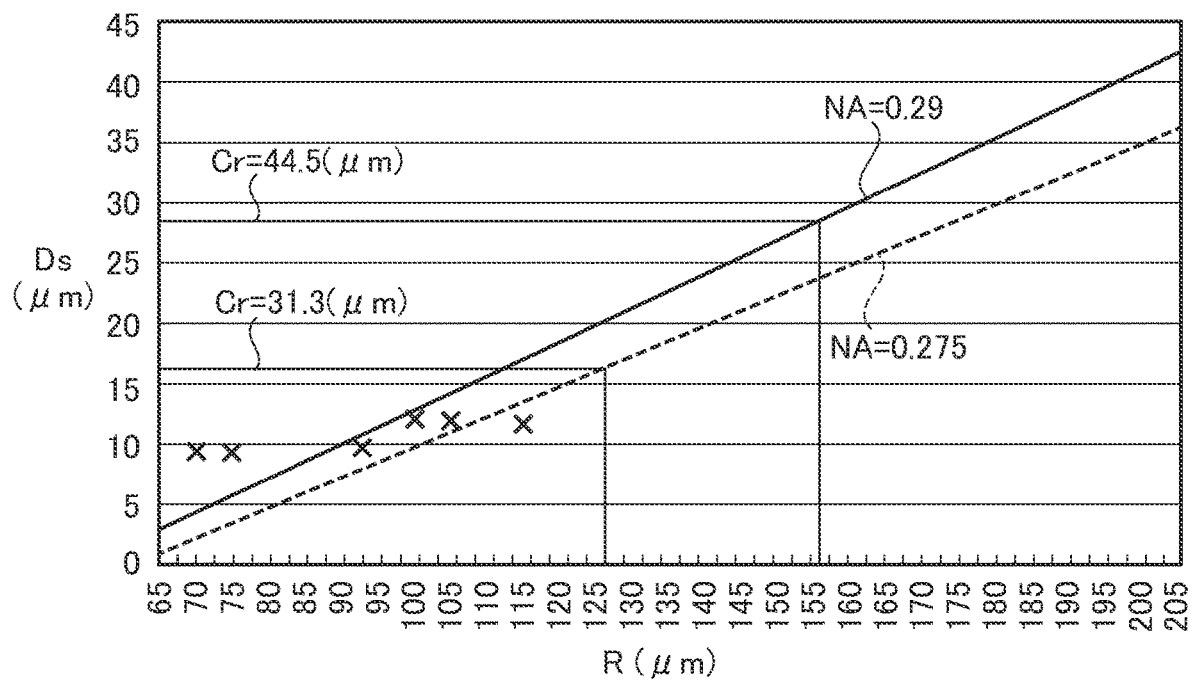
FIG. 14 is a graph showing a relation between the radius of curvature of the incident surface and an incident stable distance.

FIG. 14 is a graph showing a relation between the radius of curvature R and the incident stable distance $D_S$ in which the stable incident intensity can be obtained in the case in which the optical fibers with NA=0.275 and NA=0.29 are used for the optical probe 10. The symbols "×" shown in FIG. 14 are indicated at positions at which the actual measured values in the case of NA=0.29 are plotted. As shown in FIG. 14, the incident stable distance $D_S$ is greater as the radius of curvature R is larger. In addition, the incident stable distance $D_S$ is increased as the core diameter Cd (=2×Cr) of the optical fiber used for the optical probe 10 is larger. In the case of the core radius Cr=44.5 μm, the incident stable distance $D_S$ can be set up to approximately ±30 μm. In the case of the core radius Cr=31.3 μm, the incident stable distance $D_S$ can be set up to approximately ±15 μm.

Figure 15:
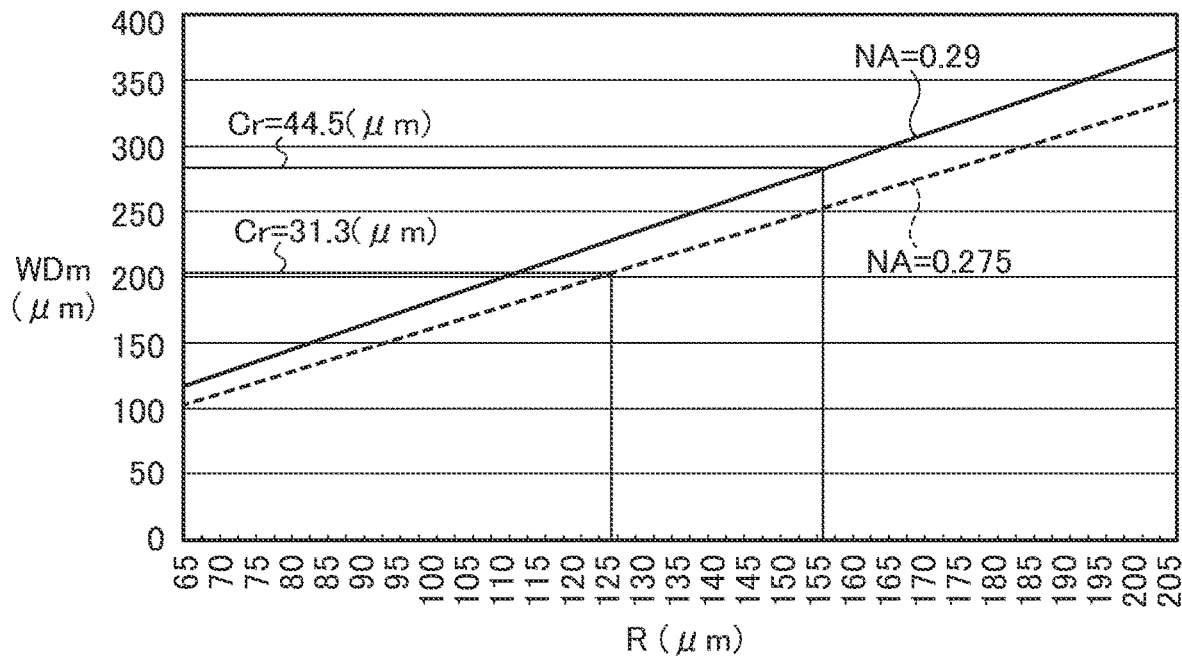
FIG. 15 is a graph showing a relation between the radius of curvature of the incident surface and the maximum working distance.

FIG. 15 is a graph showing a relation between the radius of curvature R of the incident surface 100 and the maximum working distance WDm. In the case of the core radius Cr=44.5 μm and the radius of curvature R=155 μm, the maximum working distance WDm is about less than 300 μm. In the case of the core radius Cr=31.3 μm and the radius of curvature R=125 μm, the maximum working distance WDm is about 200 μm. The maximum working distance WDm is set to fulfill the relation of WD≤WDm upon the use of the optical probe 10.

Figure 16:
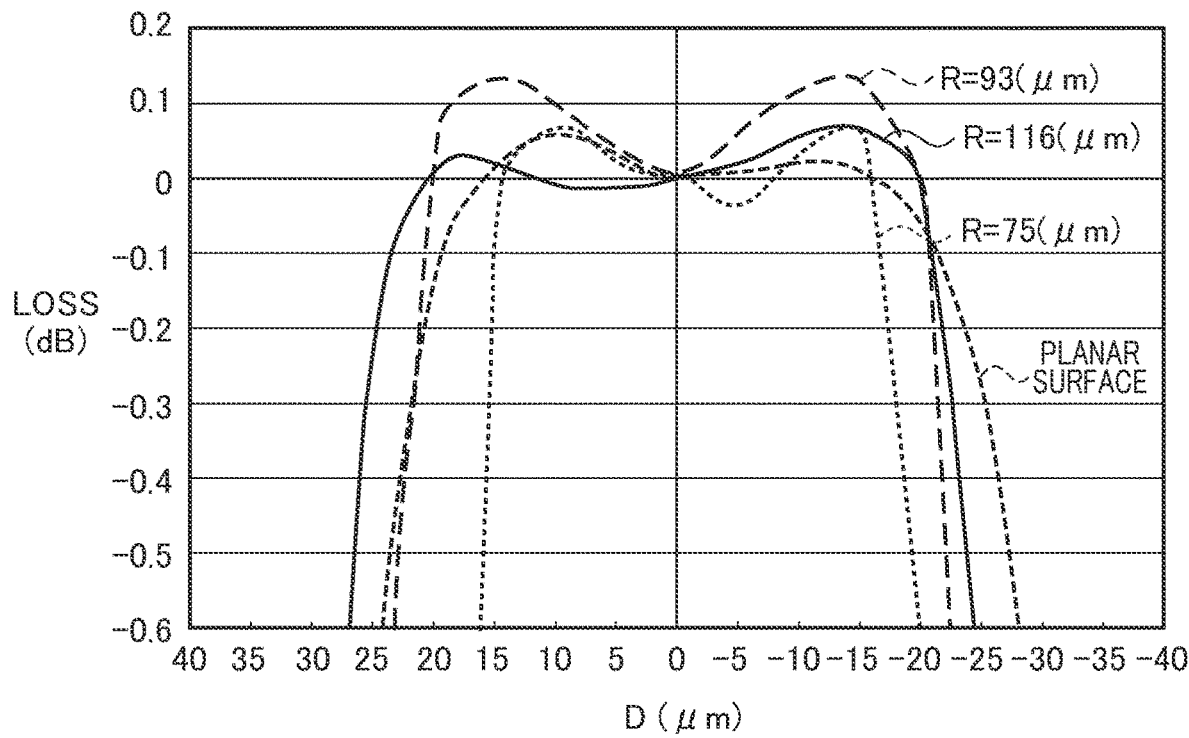
FIG. 16 is a graph showing the characteristics of loss of the optical signal introduced to the optical probe.

FIG. 16 is a graph showing the characteristics of loss of the optical signal L entering the optical probe 10 in the case of WD=100 μm. The axis of abscissas in the graph shown in FIG. 16 indicates the moving distance D. As shown in FIG. 16, when the moving distance D in which the loss variation is within 0.1 dB is defined as the incident stable distance $D_S$, the incident stable distance $D_S$ in the case of R=75 μm is ±15 μm. The incident stable distance $D_S$ in the case of R=93 μm is ±20 μm. The incident stable distance $D_S$ in the case of R=116 μm is ±20 μm or greater. The incident stable distance $D_S$ in the case of using the flat incident surface 100 is ±17 μm. The use of the curved incident surface 100 thus leads the incident stable distance $D_S$ to vary, so as to increase the incident stable distance $D_S$ more as the radius of curvature R is larger.

As described above, the optical probe 10 according to the first embodiment has the properties regarding the radius of curvature R given by the formula (17): R=Se/sin(ω) and the central half angle ω given by the formula (11): $\omega = \pm \sin^{-1}\{[K2^2/(K1^2+K2^2)]^{1/2}\}$. The radius of curvature R of the incident surface 100 is thus set so that the incident stable distance $D_S$ is increased. This decreases the incident deviation with respect to the positional deflection or the tilt angle so as to allow the optical signal L to stably enter the optical probe 10. The measurement of the optical semiconductor element 20 using the optical probe 10 thus can avoid the transmission loss of the optical signal L entering the incident surface 100 of the optical probe 10 if the tilt angle or the positional deflection is caused between the optical probe 10 and the optical semiconductor element 20 on the X-Y plane.

Moving the optical probe 10 and the optical semiconductor element 20 with respect to each other on the X-Y plane by the appropriate working distance WD in which the incident range of the optical signal L is within the core part 111 can allow the optical signal L to stably enter the incident surface 100 of the optical probe 10. The radiation angle γx of the optical semiconductor element 20 in the X-direction and the radiation angle γy of the optical semiconductor element 20 in the Y-direction thus can be measured according to the incident intensity pattern of the optical signal L obtained such that the relative distance between the optical probe 10 and the optical semiconductor element 20 is changed in each of the X-direction and the Y-direction. The incident intensity pattern of the optical signal L is measured such that the optical probe 10 is moved in the plus-minus directions in each of the X-direction and the Y-direction. As described above, the $1/e^2$ radiation angle γe and the ½ radiation angle γh can be obtained according to the incident intensity pattern. The method of obtaining the respective radiation angles by use of the incident intensity pattern of the optical signal L can also be effectively applied to the case in which the incident surface 100 of the optical probe 10 is flat.

In the present embodiment, the plural optical probes 10 illustrated in FIG. 1 may be arranged so as to compose a multicore optical probe array. For example, the m-number of optical probe groups each including the n-number of the optical probes 10 aligned in line are arranged so as to compose an optical probe array in which the (n×m)-number of the optical probes 10 are set in array. The use of the optical probe array including the plural optical probes 10 arranged to correspond to the respective optical semiconductor elements 20 can simultaneously measure the plural optical semiconductor elements 20 arranged in array on a wafer 200. This can reduce the total time for measuring the optical semiconductor elements 20 formed on the wafer 200.

Figure 17:
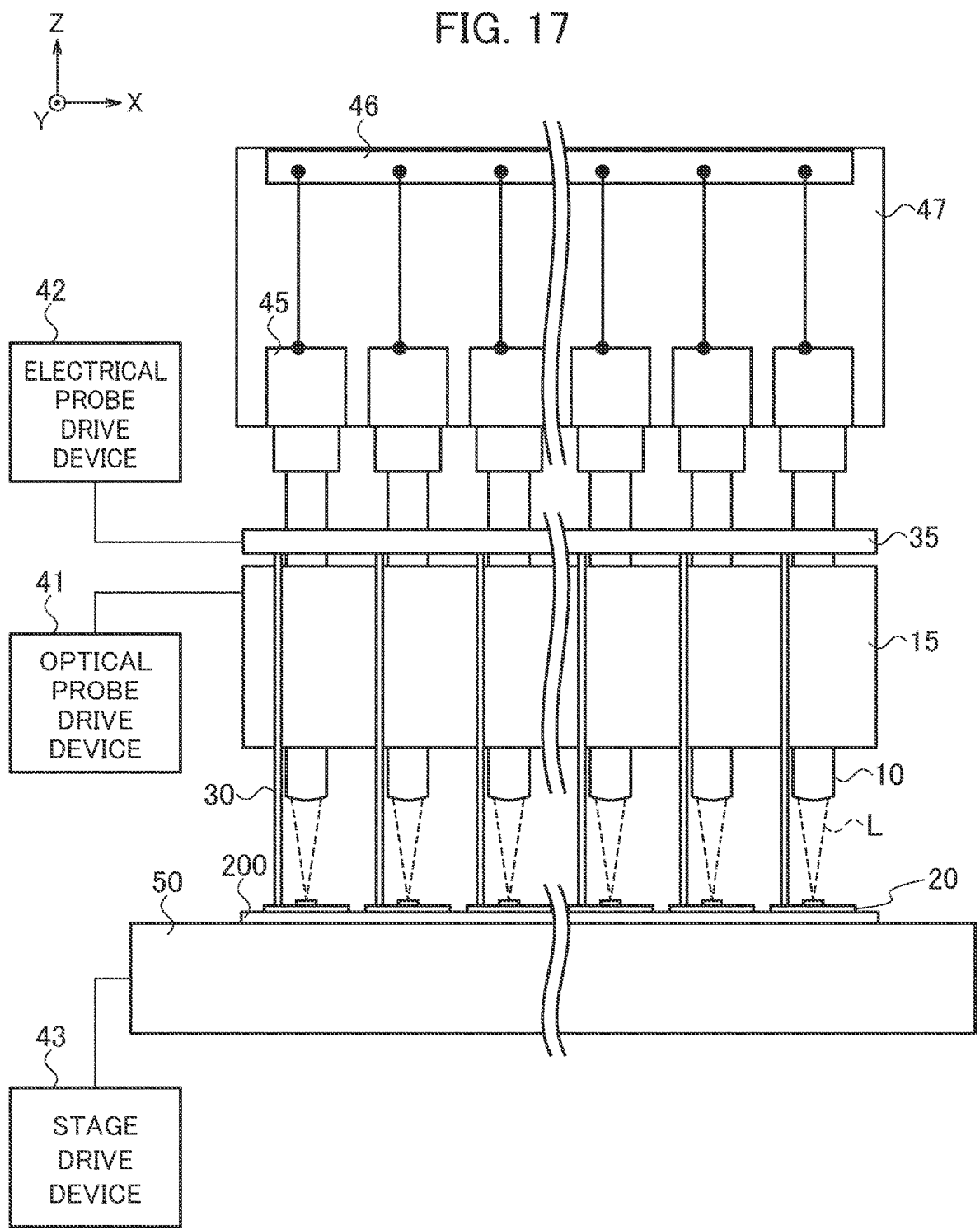
FIG. 17 is a schematic view illustrating a configuration of a measurement system using the optical probes according to the first embodiment.

FIG. 17 is a schematic view illustrating an example of a measurement system using the optical probe array described above. The measurement system illustrated in FIG. 17 includes an optical probe head 15 that holds the optical probe array in which the optical probes 10 are arranged in array, and an electrical probe head 35 that holds an electrical probe array in which a plurality of electrical probes 30 are arranged in array. Examples of the electrical probes 30 as used herein include a cantilever type, a vertical needle type, and a vertical spring type. The optical probes 10 and the electrical probes 30 are each arranged at regular intervals in the X-direction. Although not illustrated, the optical probes 10 and the electrical probes 30 are also arranged at regular intervals in the Y-direction in the same manner as in the X-direction.

The measurement system illustrated in FIG. 17 is used for measuring the properties of the plural optical semiconductor elements 20 formed on the wafer 200. The optical semiconductor elements 20 are formed in array on the main surface of the wafer 200 mounted on a stage 50. For example, a pair of the optical probe 10 and the electrical probe 30 is arranged to correspond to each optical semiconductor element 20. A single probe unit including the optical probe 10 and the electrical probe 30 is thus composed to correspond to each optical semiconductor element 20. The respective probe units are arranged to correspond to the respective optical semiconductor elements 20 formed on the wafer 200. While FIG. 17 illustrates the case in which each probe unit includes the single optical probe 10 and the single electrical probe 30, the number of the optical probes 10 and the electrical probes 30 included in the respective probe units is determined as appropriate depending on the configuration of the optical semiconductor elements 20 and the measurement contents.

The optical probe head 15 is controlled by an optical probe drive device 41 so as to move in the Z-direction. This enables a fine adjustment of the distance between the incident surfaces 100 of the optical probes 10 and the optical semiconductor elements 20 in the Z-direction. The electrical probe head 35 is controlled by an electrical probe drive device 42 so as to move in the Z-direction. This enables a fine adjustment of the distance between the tip ends of the electrical probes 30 and the optical semiconductor elements 20 in the Z-direction.

The alignment of the optical probe head 15 and the electrical probe head 35 with respect to the respective optical semiconductor elements 20 in the X-axis direction and the Y-axis direction can be made such that the stage 50 is moved by a stage drive device 43. The stage 50 is rotated about the Z-direction by the stage drive device 43, so as to adjust the positions of the optical probes 10 and the electrical probes 30 with respect to the optical semiconductor elements 20 in the rotating direction about the Z-direction (referred to below as a "Z-rotating direction").

The optical probe head 15 and the electrical probe head 35 may be moved in each of the X-axis direction, the Y-axis direction, and the Z-axis direction while the position of the stage 50 is fixed. Namely, the positions of the optical probes 10 and the electrical probes 30 with respect to the optical semiconductor elements 20 may be adjusted by the optical probe drive device 41 and the electrical probe drive device 42.

As described above, the measurement system illustrated in FIG. 17 can execute the positional alignment of the optical probes 10 and the electrical probes 30 with respect to the optical semiconductor elements 20. The measurement system may be configured such that the position of the optical probe head 15 and the position of the electrical probe head 35 are regulated independently of each other. Alternatively, the stage 50 may be moved in each of the X-axis direction, the Y-axis direction, the Z-axis direction, and the Z-rotating direction while the optical probe head 15 and the electrical probe head 35 are fixed, so as to regulate the respective positions of the optical probe head 15, the electrical probe head 35, and the respective optical semiconductor elements 20. Various kinds of adjusting methods thus can be applied to the positional alignment of the optical probes 10 and the electrical probes 30 with respect to the optical semiconductor elements 20.

The electrical signals and the optical signals are transmitted through the measurement system illustrated in FIG. 17 so as to execute the measurement of the optical semiconductor elements 20. In particular, the electrical signals output from a tester (not illustrated) are sent to the electrical probes 30 via connection terminals (not illustrated) provided in the electrical probe head 35. For example, when the respective optical semiconductor elements 20 are a VCSEL formed in a semiconductor substrate, the electrical signals are applied to electrical signal terminals arranged on the top surfaces of the VCSELs through the electrical probes 30 so that the VCSELs output the optical signals L. The optical signals L are then received by the respective optical probes 10.

The respective optical probes 10 are connected to a photoelectric converter 47 including photoelectric conversion modules 45 and an electrical connecting terminal 46. The optical signals L output from the optical semiconductor elements 20 are transmitted to the photoelectric conversion modules 45 optically connected to the optical probes 10. The photoelectric conversion modules 45 convert the optical signals into electrical signals, and output the converted electrical signals to the electrical connection terminal 46. The electrical connection terminal 46 is electrically connected to the tester (not illustrated) so that the electrical signals photoelectrically converted from the optical signals L are sent to the tester from the electrical connection terminal 46.

The photoelectric conversion modules 45 as used herein may be a type of module that converts the optical signals L into the electrical signals by a photodetector and the like, or a type of module that disperses the optical signals L by a diffraction grating device so as to detect a variation in wavelength in its diffraction angle direction. The type of the photoelectric conversion modules 45 to be used can be determined as appropriate depending on the measurement purpose. Alternatively, the optical signals L may be branched in front of the photoelectric conversion modules 45, so as to simultaneously execute various kinds of measurements. The photoelectrical conversion of the outputs from the optical probes 10 at the positions adjacent to the optical probe head 15 by use of the photoelectric converter 47 can simplify the measurement system, accelerate the measurement time, and improve the repeated reproducibility of the measurement values. The measurement of the optical semiconductor elements 20 can be made by use of an optical probe card including the optical probes 10 and the optical probe head 15 holding the optical probes 10 described above.

Figure 18:
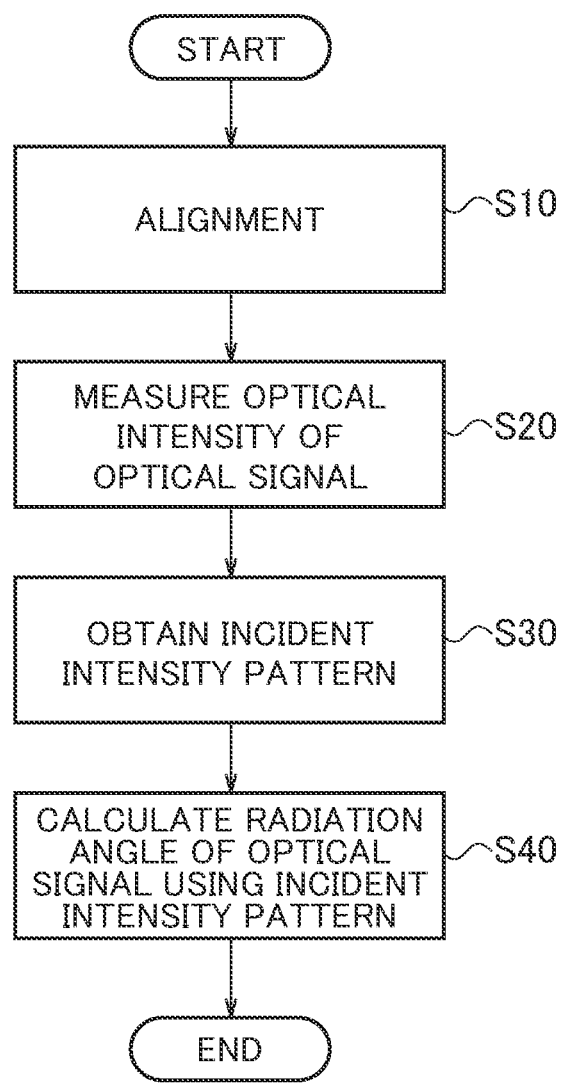
FIG. 18 is a flowchart showing an example of a measurement method using the optical probes according to the first embodiment.

The measurement of the optical semiconductor elements 20 by use of the measurement system illustrated in FIG. 17 is executed according to the flowchart as shown in FIG. 18, for example. An example of a method of measuring the optical semiconductor elements 20 is described below with reference to FIG. 18.

First, in step S10, the positional alignment of the optical probes 10 and the electrical probes 30 with respect to the optical semiconductor elements 20 is executed. The relative positions between the electrical probes 30 and the optical semiconductor elements 20 are then changed in the Z-direction so as to connect the tip ends of the electrical probes 30 to the electrical signal terminals of the optical semiconductor elements 20. The electrical signals are applied to the optical semiconductor elements 20 via the electrical probes 30 set in this state so that the optical semiconductor elements 20 output the optical signals L.

In step S20, the optical intensity of the respective optical signals L is measured. In particular, the optical probe head 15 is moved in the Z-direction so as to set the optical probes 10 to have a predetermined working distance WD. The optical signals L received by the optical probes 10 are photoelectrically converted by the photoelectric conversion modules 45 so as to monitor the optical outputs of the optical signals L. The positions of the optical probes 10 at this point are controlled so that the outputs of the optical signals L from the optical semiconductor elements 20 are led to be maximum. The optical probes 10 are fixed at the positions at which the optical outputs of the optical signals L are maximum. The optical signals L from the optical probes 10 are then measured, so as to obtain the optical intensity of the respective optical signals L.

In step S30, the relative positions between the optical probes 10 and the optical semiconductor elements 20 are changed with the working distance WD kept constant so as to obtain the incident intensity pattern. In step S40, the radiation angle γ of the respective optical signals L is then measured according to the obtained incident intensity pattern.

For example, the measurement process described above is repeated until all of the optical semiconductor elements 20 formed on the wafer 200 are measured. While this method is illustrated above with the case of measuring the properties of the optical intensity and the radiation angle of the respective optical signals L, other properties of the optical signal L other than the optical intensity and the radiation angle, such as spectral properties and various kinds of temperature properties, of course, may be measured. The order of measuring these properties may be determined as appropriate.

The use of the optical probes 10 in which the radius of curvature R of the incident surface 100 is set according to the formula (17) can allow the optical signals L to be received stably by the optical probes 10 also upon the measurement by use of the optical probe array in which the plural optical probes 10 are arranged. In other words, the optical signals L from the respective optical semiconductor elements 20 can be allowed to stably enter the respective incident surfaces 100 by use of the optical probe array if the relative positions between the optical probes 10 and the optical semiconductor elements 20 formed on the wafer 200 are changed on the X-Y plane independently of each other. The use of the optical probe array thus can simultaneously measure the respective incident intensity patterns of the plural optical semiconductor elements 20. Namely, the radiation angle yx in the X-direction and the radiation angle yy in the Y-direction can be measured simultaneously for the respective optical semiconductor elements 20 formed on the wafer 200.

Since the conventional methods cannot measure the radiation angles of the optical signals L from the respective optical semiconductor elements 20 in a wafer state, the optical semiconductor elements 20 are required to be first cut into chips and then packaged on a wiring substrate so as to measure the radiation angles by use of a beam profiler or a FFP measurement device. The conventional measurement methods thus need to package or modularize the optical semiconductor elements 20 cut into chips on the substrate in order to independently measure the radiation angles of the optical signals L for the respective optical semiconductor elements 20. This takes a lot of work and time for the measurement of the radiation angles. Since the optical semiconductor elements 20 are measured independently of each other, the measurement takes a lot of time, and it is difficult to complete the measurement for all of the optical semiconductor elements 20. Further, when a part of the optical semiconductor elements 20 are sampled and inspected, the examination of the quality cannot be made for the rest of the optical semiconductor elements 20. The conventional methods thus have a problem of improving a yield.

In contrast, the measurement system illustrated in FIG. 17 uses the multicore optical probe array including the plural optical probes 10, so as to measure the radiation angles of the optical signals L collectively for the plural optical semiconductor elements 20 in the wafer state. This can reduce the measurement time. In addition, all of the optical semiconductor elements 20 can be inspected, so as to improve the yield accordingly.

As described above, the optical probe 10 according to the first embodiment contributes to increasing the incident stable distance $D_S$=Se−Sr by adjusting the radius of curvature R of the incident surface 100. This enables the change in the relative distance between the optical probe 10 and the optical semiconductor element 20 on the X-Y plane at the constant working distance WD so as to obtain the incident intensity pattern of the optical signal L in each of the X-direction and the Y-direction. Namely, the radiation angle yx in the X-direction can be calculated by use of the incident intensity pattern obtained in the X-direction, and the radiation angle yy in the Y-direction can be calculated by use of the incident intensity pattern obtained in the Y-direction. In addition, the $1/e^2$ radiation angle γe and the ½ radiation angle γh can be obtained in each of the X-direction and the Y-direction. The radiation angles of the optical signal L in which the far field pattern has an oval shape, for example, thus can be measured.

In addition, the optical probe 10 has the large incident stable distance $D_S$, and can avoid the incident deviation derived from the tilt angle ζ. The optical probe array in which the optical probes 10 are arranged can avoid the incident deviation if a positional displacement or an angular displacement between the optical probes 10 and the optical semiconductor elements 20 is caused when the plural optical semiconductor elements 20 formed on the wafer 200 are measured with the single positioning. In each of the optical probes 10, the optical signals L from the optical semiconductor elements 20 thus can be allowed to enter in the stable state.

Further, since the intensity and the radiation angle of the respective optical semiconductor elements 20 can be measured in the wafer state, the process of measuring the optical semiconductor elements 20 can be simplified, so as to greatly reduce the measurement time. The electrical probes 30 may be arranged in array on another substrate separately from the optical probe array, or the optical probe array and the electrical probe array may be combined to have an integrated structure. In the case of using the integrated structure of the optical probe array and the electrical probe array, the electrical probes 30 in the state of being connected to the electrical signal terminals of the optical semiconductor elements 20 are moved in the X-direction, the Y-direction, and the Z-direction. In view of this, the shape, the material, and the structure having deformable and elastic strain properties are used for the electrical probes 30 so as to stably supply the electrical signals to the electrical signal terminals without causing a change in the contact state between the electrical probes 30 and the electrical signal terminals upon the movement of the electrical probes 30 in contact with the electrical signal terminals.

Second Embodiment

Figure 19:
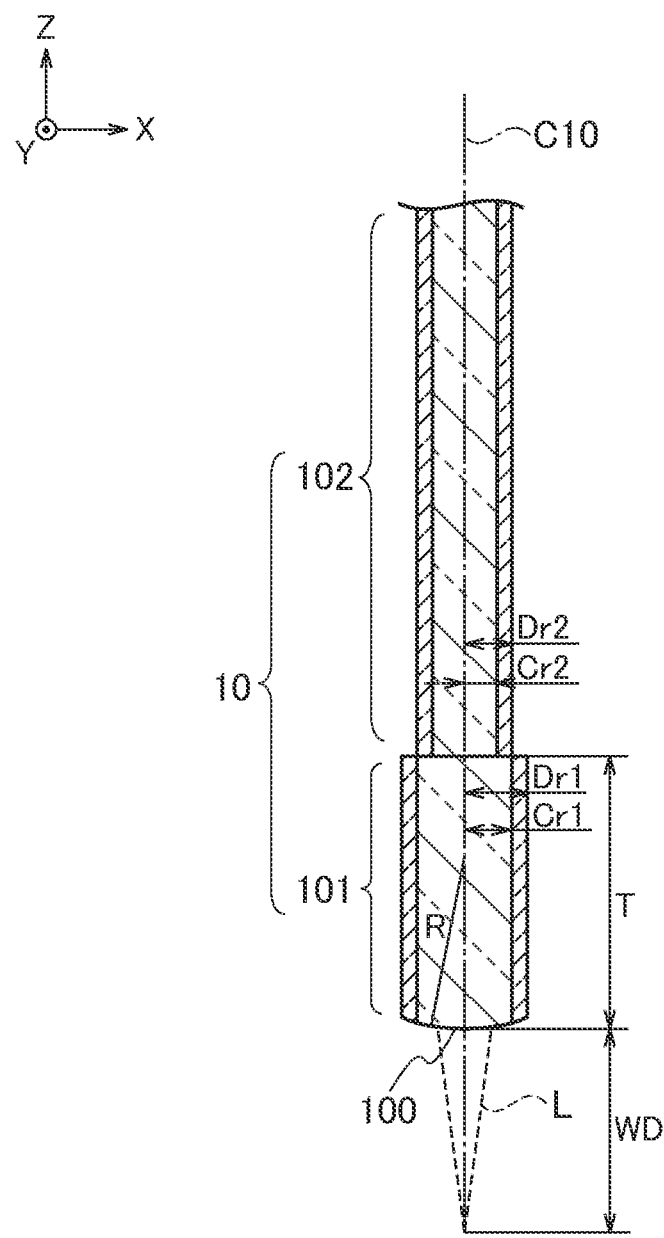
FIG. 19 is a schematic view illustrating a configuration of an optical probe according to a second embodiment.

The optical probe 10 according to a second embodiment has a structure in which a first region 101 and a second region 102 are connected, as illustrated in FIG. 19. One end surface of the first region 101 serves as the incident surface 100, and the other end surface of the first region 101 is joined to the end surface of the second region 102. The respective central axes C10 of the first region 101 and the second region 102 conform to each other.

The first region 101 provided with the incident surface 100 has the same structure as the optical probe 10 described in the first embodiment. The incident surface 100 of the first region 101 is a curved surface in which the radius of curvature R and the central half angle ω are set so as to fulfil the relations according to the formula (17) and the formula (11). A GI optical fiber is used for the first region 101, for example.

The optical probe 10 illustrated in FIG. 19 is manufactured as described below, for example. First, the respective end surfaces of a GI optical fiber having a large diameter used for the first region 101 and a GI optical fiber having a standard-size diameter used for the second region 102 are fused to be connected to each other. The GI optical fiber with the large diameter is cut to have a predetermined length of the first region 101. The end surface of the GI optical fiber with the large diameter is then processed so as to have the radius of curvature R.

The length L of the first region 101 may be set such that the optical signal L is focused on the boundary between the first region 101 and the second region 102. The length T is given by $T=2\pi \times P/A^{1/2}$ when the GI fiber is used, where P is a pitch length in which one pitch corresponds to one period, and $A^{1/2}$ is a graded-index constant that is defined according to a normalized index difference Δ between refractive indexes of the central axis C10 and the clad part 112 and the core diameter Cr. When the pitch length P is presumed to be set to 0.27, the length T is given by $T=0.54 \pi/A^{1/2}$. To set the focused position of the optical signal L around the boundary between the first region 101 and the second region 102, the total distance from the optical semiconductor element 20 to the boundary between the first region 101 and the second region 102 corresponds to 0.5 P that is the half period in the case of $WD=0.46\pi \times n(c)/A^{1/2}$. The optical signal L is thus focused on the position around the boundary between the first region 101 and the second region 102 so that the optical signal L enters the inside of the core of the second region 102 fused and connected to the first region 101.

As illustrated in FIG. 19, a core radius Cr1 and a probe radius Dr1 of the first region 101 may be different from a core radius Cr2 and a probe radius Dr2 of the second region 102. The optical probe 10 illustrated in FIG. 19 has a thickness of the clad part 112 that is the same in each of the first region 101 and the second region 102, while the diameter of the second region 102 is smaller than the diameter of the first region 101. The core radius Cr1 of the first region 101 is larger than the core radius Cr2 of the second region 102. For example, the GI optical fiber having a large diameter may be used for the first region 101, and the GI optical fiber having a standard-size diameter may be used for the second region 102 so as to compose the optical probe 10. Using the GI optical fiber with the standard-size diameter for the second region 102 can allow the end part of the optical probe 10 to be connected to an optical circuit component, a coupler, or an optical switch using an optical fiber having a standard-size diameter, so as to implement a multi-input optical circuit with a loss reduced.

Third Embodiment

Figure 20:
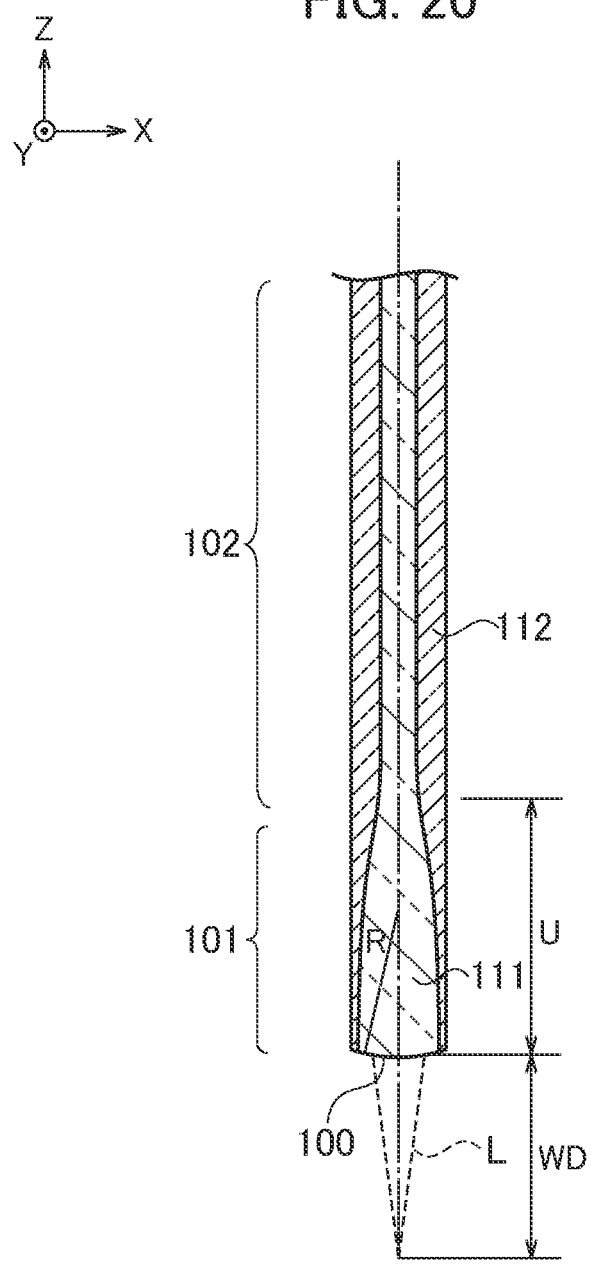
FIG. 20 is a schematic view illustrating a configuration of an optical probe according to a third embodiment.

The optical probe 10 according to a third embodiment illustrated in FIG. 20 has a configuration in which an additive that increases the refractive index of the core part 111 is dispersed into a constant length U along the central axis C10 from the incident surface 100. The optical probe 10 illustrated in FIG. 20 includes the first region 101 defined from the incident surface 100 to have the length U, and the second region 102 connected to the first region 101. For example, the first region 101 using an optical fiber having a typical core diameter Cd that is 50 μm or 62.5 μm is heated at a temperature of about 1200° C. to 1400° C. This disperses a substance such as germanium (Ge) that increases the refractive index in the core part 111 in the first region 101 toward the first region 101.

The addition of the substance that increases the refractive index to the first region 101 increases the transmission region of the optical signal L in the radial direction. This increases the core diameter Cd of the incident surface 100 to about 80 μm to 100 μm. The incident region of the optical signal L on the incident surface 100 is thus increased, so as to improve tolerance properties. The increase in the core diameter Cd decreases the refractive index n(c) of the core part 111 at the central axis C10. The numerical aperture NA is thus decreased, so as to regulate the value of the numerical aperture NA by the radius of curvature R of the incident surface 100.

The use of the typical optical fiber for the optical probe 10 as described above facilitates the connection between the optical probe 10 and an element in an optical circuit system such as a branch circuit and an optical switching circuit. The optical probe 10 is thus easy to treat in the optical measurement system.

Other Embodiments

While the present invention has been described above with reference to the respective embodiments, it should be understood that the present invention is not intended to be limited to the descriptions and the drawings composing part of this disclosure. Various alternative embodiments, examples, and technical applications will be apparent to those skilled in the art according to this disclosure.

For example, while the respective embodiments are illustrated above with the optical probe 10 using the graded-index optical fiber, a step-index optical fiber may be used for the optical probe 10 instead. The use of a structure having an optical waveguide with a constant gap and having the incident surface 100 formed to have the radius of curvature R or a structure equipped with a lens having the same configuration and function can also achieve the equivalent effects.

It should be understood that the present invention includes various embodiments not disclosed herein.

REFERENCE SIGNS LIST

10 OPTICAL PROBE
15 OPTICAL PROBE HEAD
20 OPTICAL SEMICONDUCTOR ELEMENT
30 ELECTRICAL PROBE
35 ELECTRICAL PROBE HEAD
41 OPTICAL PROBE DRIVE DEVICE
42 ELECTRICAL PROBE DRIVE DEVICE
43 STAGE DRIVE DEVICE
50 STAGE
100 INCIDENT SURFACE
111 CORE PART
112 CLAD PART
200 WAFER

What is claimed is:

1. An optical probe comprising a core part and a clad part arranged along an outer circumference of the core part, the optical probe having an incident surface through which an optical signal from an optical semiconductor element enters, the incident surface having a radius of curvature R, wherein the radius of curvature R and a central half angle ω at an incident point of the optical signal on the incident surface fulfil the following formulae using a radiation angle γ of the optical signal, an effective incident radius Se of the optical signal transmitted in the core part without penetrating into the clad part on the incident surface, a refractive index n(r) of the core part at the incident point, and a refracting angle β at the incident point, wherein:

$\beta = \sin^{-1}[\sin(\gamma/2)/n(r)]$ $R = Se/\sin(\omega)$ $\omega = \pm \sin^{-1}\{[K2^2/(K1^2+K2^2)]^{1/2}\}$ where $K1=n(r)\times\cos(\beta)-\cos(\gamma/2)$ and $K2=n(r)\times\sin(\beta)-\sin(\gamma/2)$.

2. The optical probe according to claim 1, wherein the radius of curvature R fulfills the following formula using a radiation half angle α of the optical signal when the effective incident radius Se and a core radius Cr of the optical probe conform to each other, and a distance between the optical semiconductor element and the incident surface is a possible maximum working distance:

$$R \geq Cr/\sin(\omega)$$

where $K1=n(r)\times\cos(\beta)-\cos(\alpha)$, $K2=n(r)\times\sin(\beta)-\sin(\alpha)$, and $\alpha=\sin^{-1}[n(r)\times\sin(\beta+\omega)]-\omega$.

3. The optical probe according to claim 2, wherein:
the maximum working distance WDm is $Cr/\tan(\alpha)$; and
a working distance WD fulfills WD≤WDm.

4. The optical probe according to claim 1, wherein a first region connected to the incident surface and a second region having a smaller diameter of the core part than the first region are connected to each other.

5. The optical probe according to claim 1, wherein an additive that increases the refractive index of the core part is dispersed into a predetermined length along a central axis from the incident surface.

6. A probe card comprising:
the optical probe according to claim 1; and
an optical probe head configured to hold the optical probe.

7. A measurement system comprising:
the optical probe according to claim 1;
an optical probe head configured to hold the optical probe;
an optical probe drive device configured to control a position of the optical probe head;
an electrical probe head configured to hold an electrical probe that transmits an electrical signal to the optical semiconductor element; and
an electrical probe drive device configured to control a position of the electrical probe head,
wherein a single probe unit including the optical probe and the electrical probe is arranged to correspond to the single optical semiconductor element.

8. The measurement system according to claim 7, wherein:
the system comprises a plurality of the optical probes to implement an optical probe array in which the optical probes are arranged in array; and
the optical probe head holds the optical probe array.

9. A measurement method using the optical probe according to claim 1, the method comprising:
moving the optical semiconductor element with respect to the optical probe while keeping a working distance between the optical semiconductor element and the incident surface constant so as to obtain an incident intensity pattern indicating a relation of an incident intensity of the optical signal with respect to a moving distance; and
calculating a radiation angle of the optical signal by use of the incident intensity pattern.

10. The measurement method according to claim 9, wherein a $1/e^2$ radiation angle γe at which the incident intensity is $1/e^2$ of a peak value is calculated according to the following formula using a moving distance De in which the incident intensity is $1/e^2$ of the peak value and a working distance WD:

$$\gamma e=2\times\tan^{-1}[De/(4\times WD)].$$

11. The measurement method according to claim 9, wherein a ½ radiation angle γh at which the incident intensity is ½ of a peak value is calculated according to the following formula using a moving distance Dh in which the incident intensity is ½ of the peak value and a working distance WD:

$$\gamma h=2\times\tan^{-1}[Dh/(4\times WD)].$$

12. The measurement method according to claim 9, wherein:
the effective incident radius Se and an incident radius Sr of the optical signal fulfil the following formulae using an incident moving range Dw in which at least part of the optical signal enters the core part of the optical probe and an incident stable range Dp corresponding to a flat part of the incident intensity pattern:

$$Se=\tfrac{1}{4}\times(Dw+Dp)$$

$$Sr=\tfrac{1}{4}\times(Dw-Dp);\text{ and}$$

a $1/e^2$ radiation angle ye at which the incident intensity is $1/e^2$ of a peak value and a ½ radiation angle γh at which the incident intensity is ½ of the peak value are calculated according to the following formulae using a moving distance De in which the incident intensity is $1/e^2$ of the peak value and a moving distance Dh in which the incident intensity is ½ of the peak value:

$$\gamma e=2\times De/Dh\times\tan^{-1}(Sr/WD)$$

$$\gamma h=2\times\tan^{-1}(Sr/WD).$$

13. The measurement method according to claim 9, wherein:
the radiation angle γ is measured by a measurement device using the optical probe for the optical semiconductor element used as a reference;
an assumed working distance cWD is calculated according to a measured value obtained by the measurement device; and
the radiation angle of the optical signal is calculated using the assumed working distance and the moving distance.

14. The measurement method according to claim 9, wherein:
the optical semiconductor element is moved in each of an X-direction and a Y-direction on an X-Y plane perpendicular to an extending direction of an optical axis of the optical signal;
the radiation angle in the X-direction is calculated by use of the incident intensity pattern obtained in the X-direction; and
the radiation angle in the Y-direction is calculated by use of the incident intensity pattern obtained in the Y-direction.

* * * * *